(12) United States Patent
Suzuki

(10) Patent No.: US 11,348,914 B2
(45) Date of Patent: *May 31, 2022

(54) SEMICONDUCTOR DEVICE

(71) Applicant: SOCIONEXT INC., Yokohama (JP)

(72) Inventor: Teruo Suzuki, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 565 days.

This patent is subject to a terminal disclaimer.

(21) Appl. No.: 16/277,161

(22) Filed: Feb. 15, 2019

(65) Prior Publication Data

US 2019/0181132 A1 Jun. 13, 2019

Related U.S. Application Data

(62) Division of application No. 15/169,002, filed on May 31, 2016, now Pat. No. 10,249,606.

(30) Foreign Application Priority Data

Jun. 19, 2015 (JP) ................................. 2015-123990

(51) Int. Cl.
*H01L 27/02* (2006.01)

(52) U.S. Cl.
CPC ........ *H01L 27/0255* (2013.01); *H01L 27/027* (2013.01)

(58) Field of Classification Search
CPC .......................... H01L 27/0255; H01L 27/027
USPC .......................................................... 361/56
See application file for complete search history.

(56) References Cited

U.S. PATENT DOCUMENTS

| 8,164,872 B2 | 4/2012 | Suzuki |
| 8,395,869 B2 | 3/2013 | Tsai et al. |
| 2005/0135033 A1* | 6/2005 | Kitagawa ............ H01L 27/0266 361/91.1 |

(Continued)

FOREIGN PATENT DOCUMENTS

| JP | 2006-14263 A | 1/2006 |
| JP | 2006-100606 A | 4/2006 |

(Continued)

OTHER PUBLICATIONS

Office Action dated Dec. 17, 2019, issued in counterpart JP Application No. 2019-043628, with English translation (6 pages).

(Continued)

*Primary Examiner* — Thienvu V Tran
*Assistant Examiner* — Bart Iliya
(74) *Attorney, Agent, or Firm* — WHDA, LLP

(57) ABSTRACT

A semiconductor device includes: a first domain including a first high power source line, a first low power source line, and a first power clamp circuit; a second domain including a second high power source line, a second low power source line, and a second power clamp circuit; a third power clamp circuit provided between the second high power source line and the first low power source line; a first relay circuit that receives a signal from the first domain and outputs the signal to the second domain; and a second relay circuit that receives a signal from the second domain and outputs the signal to the first domain, wherein the first relay circuit and the second relay circuit have a circuit portion that is connected to the second high power source line and the first low power source line.

9 Claims, 21 Drawing Sheets

(56) References Cited

U.S. PATENT DOCUMENTS

| | | |
|---|---|---|
| 2005/0286187 A1 | 12/2005 | Liu et al. |
| 2006/0077601 A1 | 4/2006 | Ikeda et al. |
| 2009/0195951 A1 | 8/2009 | Sorgeloos et al. |
| 2010/0309594 A1* | 12/2010 | Sadamatsu ................ H03F 1/52 |
| | | 361/56 |
| 2012/0033335 A1 | 2/2012 | Wang et al. |
| 2012/0216089 A1 | 8/2012 | Chen et al. |
| 2012/0300349 A1 | 11/2012 | Abou-Khalil et al. |
| 2012/0326753 A1 | 12/2012 | Jao |
| 2013/0321961 A1 | 12/2013 | Lin et al. |
| 2014/0126089 A1 | 5/2014 | Chang et al. |
| 2015/0171738 A1* | 6/2015 | Tanabe .................... G06F 1/263 |
| | | 307/24 |
| 2016/0225758 A1 | 8/2016 | Lai et al. |
| 2016/0372453 A1 | 12/2016 | Suzuki |

FOREIGN PATENT DOCUMENTS

| | | |
|---|---|---|
| JP | 2010-239046 A | 10/2010 |
| JP | 2013-183107 A | 9/2013 |

OTHER PUBLICATIONS

Okushima, "ESD Protection Design for Mixed-Power Domains in 90nm CMOS with New Efficient Power Clamp and GND Current Trigger (GCT) Technique", EOS/ESD Symposium, 2006, ESDA, Cited in Specification (9 pages).

Office Action dated Oct. 26, 2018, issued in counterpart Chinese Application No. 201610429034.1, with English translation. (18 pages).

* cited by examiner

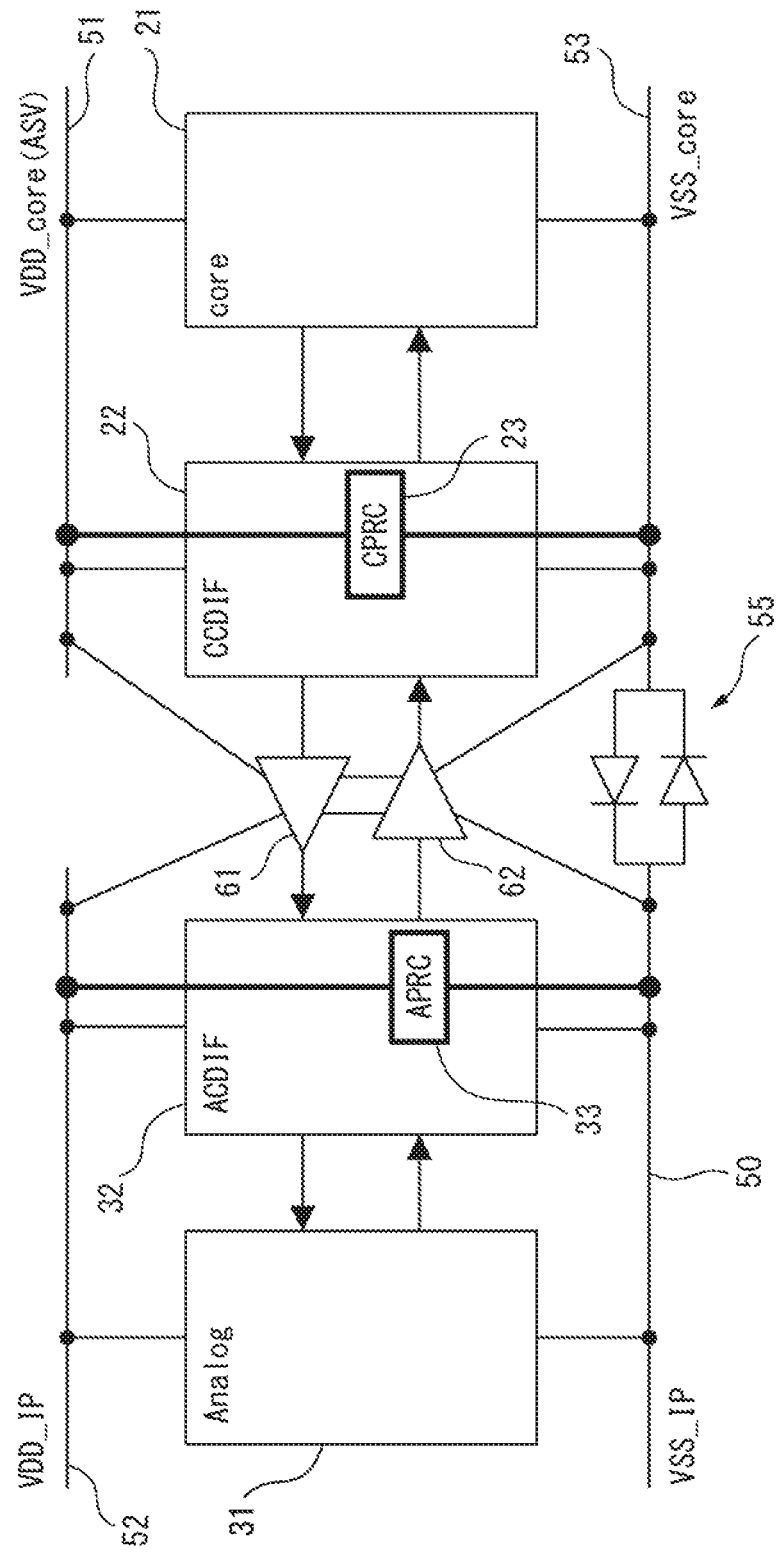

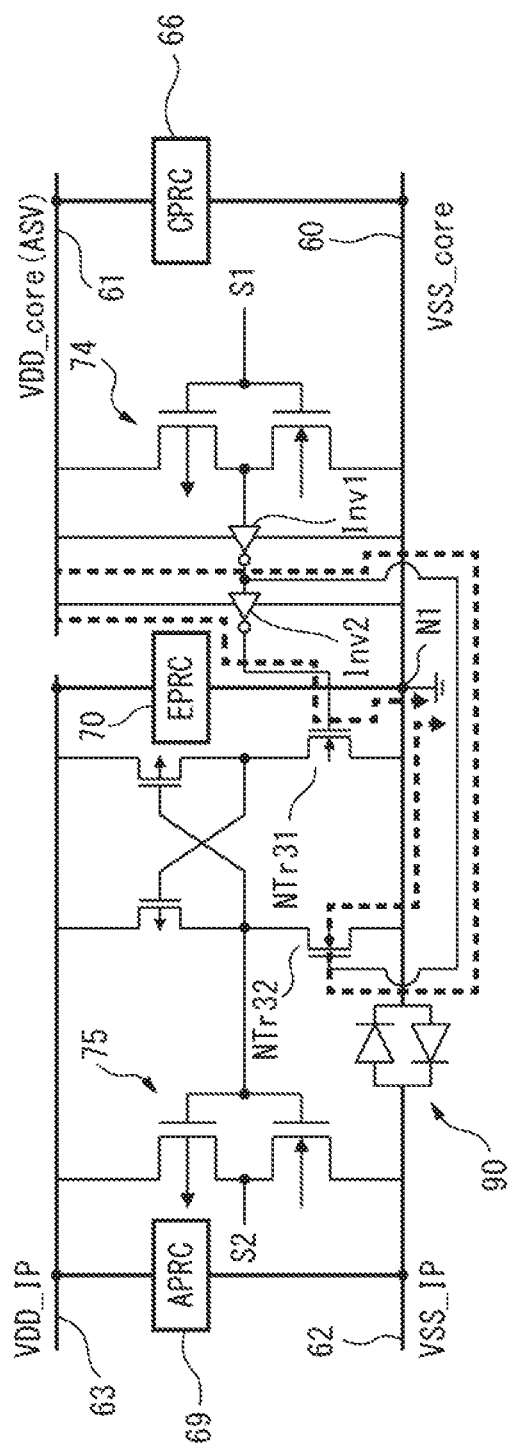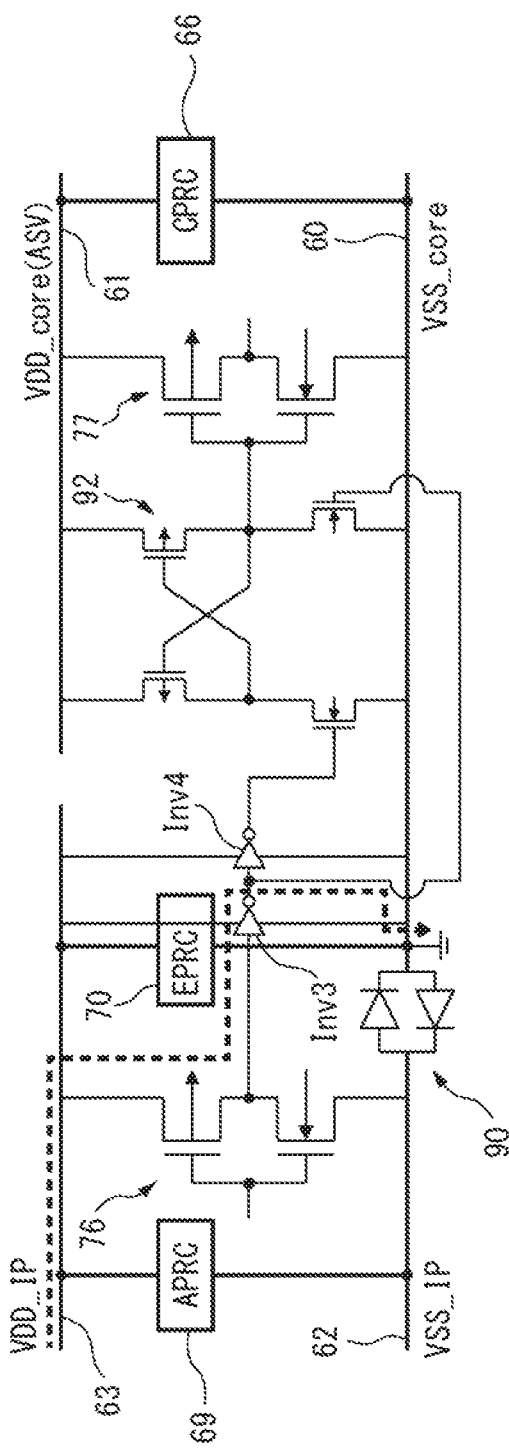
FIG. 20A
FIG. 20B

SEMICONDUCTOR DEVICE

CROSS-REFERENCE TO RELATED APPLICATION

This application is a divisional of U.S. application Ser. No. 15/169,002 filed May 31, 2016, which is based upon and claims the benefit of priority of the prior Japanese Patent Application No. 2015-123990, filed on Jun. 19, 2015, the entire contents of which are incorporated herein by reference.

FIELD

The present invention relates to a semiconductor device.

BACKGROUND

In a semiconductor device, circuits having different power source voltages are mounted mixedly. In the case where a plurality of circuits having different power source voltages is mounted, it is preferable to separate power source lines. This case includes a case where both the low (potential) power source lines and the high (potential) power source lines are separated and a case where the low power source lines are connected in common and only the high power source lines are separated. Further, even in the case where the power source voltage is the same, in the circuit, such as an analog circuit, which is vulnerable to the influence of noise, both the power source lines are separated. The circuit portion in which at least the high power source lines are separated is referred to as a domain.

It is known that the semiconductor device is affected by Electro-static discharge (ESD), resulting in the occurrence of damage and an erroneous operation, and therefore, an ESD protection circuit to protect the semiconductor device from discharge is provided. As an ESD model that damages a semiconductor device, there are a test model (human body model:HBM) from an external statically charged object, a test model (charged device model: CDM) by static charge of the semiconductor device itself, etc., and the test method or the like for them are specified. The ESD protection circuit protects a semiconductor device from discharge corresponding to these ESD models. The ESD protection circuit is provided for a wire that is directly connected to an external terminal and for an element that is connected to the wire.

In the case where the semiconductor device has one common high power source line and one common low power source line, it is sufficient to provide the ESD protection circuit at the portion that is connected to the external terminal. However, in the case where the semiconductor device has a plurality of domains, there is such a problem that the signal path between the domains is affected by the ESD and the element of the signal path is damaged. Because of this, for the semiconductor device having a plurality of domains, it is known that the signal path between the domains also needs to be protected in view of the ESD.

In recent years, due to the reduction in power consumption, the power source voltage of the semiconductor device is reduced remarkably, and a phenomenon occurs in which the power source voltage with which desired performance can be obtained in a core (logic) circuit of a semiconductor device differs from chip to chip because of the variation in the process. The range of the power source voltage with which the desired performance can be obtained becomes large, which cannot be ignored, and if the power source voltage is reduced to attain low power consumption, such a problem occurs that the yields of a chip are reduced or the chip does no operate normally. Because of this, the power source voltage with which the desired performance can be obtained in the core circuit is measured for each chip at the time of manufacture, and the actual core circuit is caused to operate on the measured power source voltage. Due to this, a reduction in power consumption and improvement of yields are implemented. In this case, for the circuits other than the core circuit, such as the input or output circuit for an external interface, the PLL circuit, and the analog circuit for which the voltage is specified, the power source voltage is set to a certain voltage, respectively, and is not changed in accordance with the results of the variation in the process. Consequently, for example, the analog circuit is designed so as to operate on a power source voltage of 1.8 V and the core circuit is designed so as to operate on 1.8 V or lower, and the core circuit is caused to operate on an appropriate voltage lower than or equal to 1.8 V, for example, 1.5 V, in accordance with the variation in the process. The technique to change the power source voltage such as this is called the adaptive source voltage (ASV) technique.

In the case where the ASV technique is applied, the power source voltage of the core circuit differs from that of the other circuits, and therefore, it is preferable to separate the power source of each circuit, i.e., to provide a plurality of domains. As described previously, when a plurality of domains is provided, there are a case where both the low (potential) power source lines and the high (potential) power source lines are separated and a case where the low power source lines are connected in common and only the high power source lines are separated. For the circuit that is vulnerable to the influence of noise, such as the analog circuit, both the low power source lines and the high power source lines are separated. The target is a semiconductor device having a plurality of domains, i.e., in which both the low power source lines and the high power source lines are separated.

Further, the signal between the core circuit and the analog circuit is a digital signal and there is a case where no problem occurs even if the signal of the core circuit is input to the analog circuit or the signal of the analog circuit is input to the core circuit, but there is also a case where a level shifter is provided in view of reliability.

RELATED DOCUMENTS

[Patent Document 1] Japanese Laid Open Patent Publication No. 2006-014263
[Patent Document 2] Japanese Laid Open Patent Publication No. 2013-183107
[Patent Document 3] Japanese Laid Open Patent Publication No. 2010-239046
[Non Patent Document 1] "ESD Protection Design for Mixed-Power Domains in 90 nm CMOS with New Efficient Power Clamp and GND Current Trigger (GCT) Technique" Mototsugu Okushima, EOS/ESD SYMPOSIUM 06-205

SUMMARY

According to an aspect of the invention, a semiconductor device includes: a first domain including a first high power source line, a first low power source line, and a first power clamp circuit provided between the first high power source line and the first low power source line; a second domain including a second high power source line separated from the first high power source line, a second low power source line separated from the first low power source line, and a second power clamp circuit provided between the second high power source line and the second low power source line; a third power clamp circuit provided between the second high power source line and the first low power source line; a first relay circuit that receives a signal from the first domain and outputs the signal to the second domain; and a second relay circuit that receives a signal from the second domain and outputs the signal to the first domain, wherein the first relay circuit and the second relay circuit have a circuit portion that is connected to the second high power source line and the first low power source line.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating a configuration in the case where low power source lines are separated and are connected by a bidirectional diode in the configuration example in FIG. 3;

FIG. 11A illustrates the level shifter of the signal from the core circuit to the analog circuit and FIG. 11B illustrates the level shifter of the signal from the analog circuit to the core circuit;

FIG. 13A illustrates an example of a timed MOSFET type power rail clamp (PRC) and FIG. 13B illustrates an example of a parasitic bipolar type power rail clamp;

FIG. 20A and FIG. 20B are diagrams explaining the flow of charge by the ESD when a low power source line in the core logic area is grounded in the fourth embodiment, and FIG. 20A illustrates the flow of charge in the core logic area and in the first level shifter and FIG. 20B illustrates the flow of charge in the analog area and in the second level shifter;

FIG. 22A illustrates the configuration of the first level shifter and FIG. 22B illustrates the configuration of the second relay circuit.

DESCRIPTION OF EMBODIMENTS

Before explaining the embodiment, a semiconductor device having a plurality of domains and ESD protection are explained.

Figure 1:
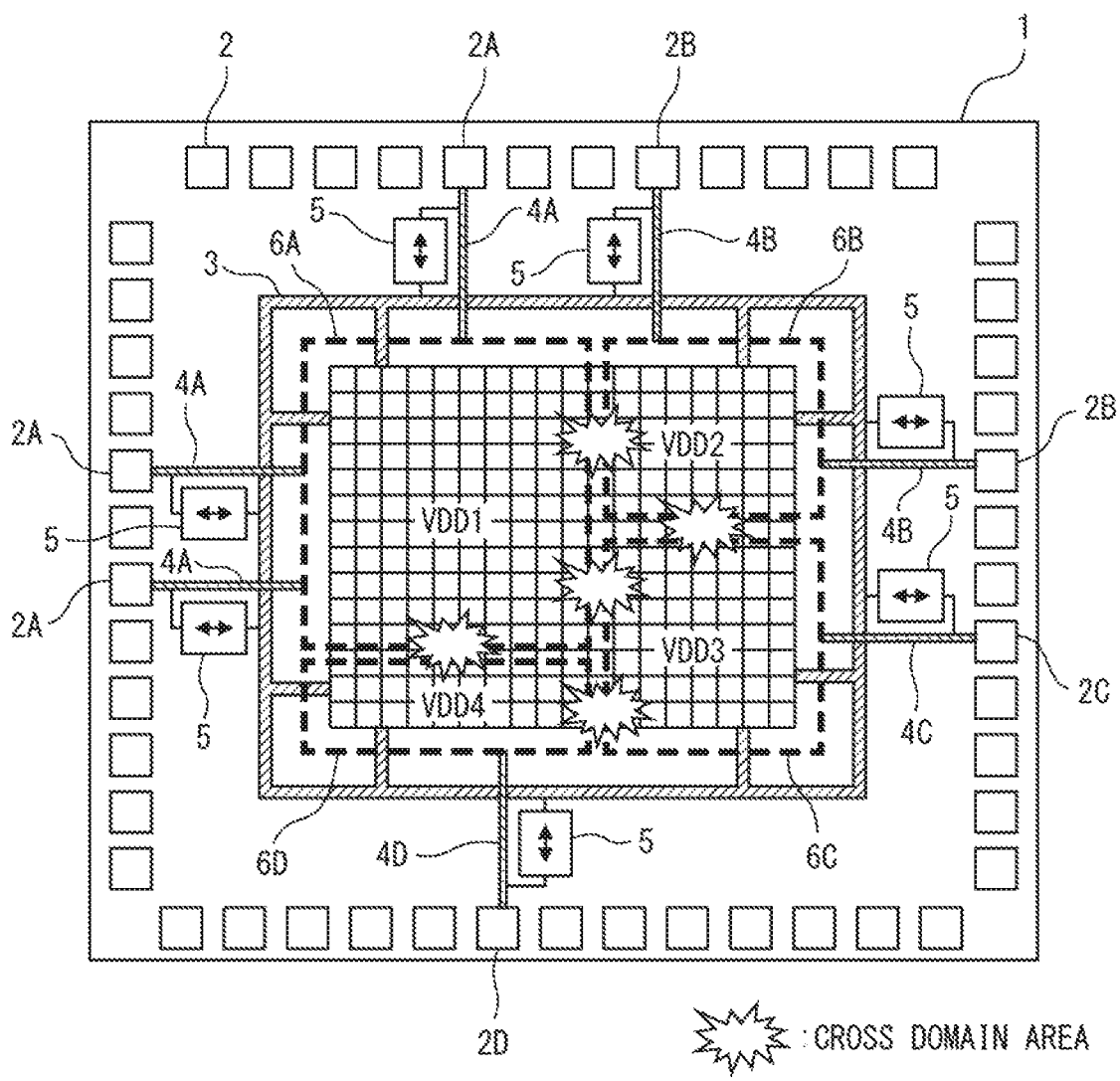
FIG. 1 is a top view of an example semiconductor device having a plurality of domains.

FIG. 1 is a top view of an example semiconductor device having a plurality of domains.

A semiconductor device 1 has a plurality of terminals 2 arranged along the four sides, a low (VSS) power source line 3, and a plurality of domains 6A to 6D. The plurality of terminals 2 includes three terminals 2A that supply a power source to the high power source line in the domain 6A, two terminals 2B that supply a power source to the high power source line in the domain 6B, and a terminal 2C and a terminal 2D that supply a power source to the high power source lines in the domain 6C and the domain 6D, respectively.

Each of the domains 6A to 6D internally has a low power source line, a high power source line, and a circuit portion, and the low power source line of each domain is connected to the low power source line 3. Consequently, in the semiconductor device illustrated in FIG. 1, the low (VSS) power source lines in the domains 6A to 6D are connected to one another. The high (VDD) power source lines in the domains 6A to 6D are separated. To the high power source line in the domain 6A, VDD1 is supplied from the three terminals 2A through power source supply lines 4A and to the high power source line in the domain 6B, VDD2 is supplied from the two terminals 2B through power source supply lines 4B. To the high power source line in the domain 6C, VDD3 is supplied from the one terminal 2C through a power source supply line 4C and to the high power source line in the domain 6D, VDD4 is supplied from the one terminal 2D through a power source supply line 4D. A power supply clamp circuit 5 is connected between the power source supply lines 4A to 4D and the low (VSS) power source line 3. The power supply clamp circuit 5 is a circuit that protects the semiconductor device from the influence of discharge by an external statically charged object, and is implemented by, for example, a PRC (Power Rail Clamp) circuit, to be described later.

Although not illustrated, the low (VSS) power source terminal 3 is connected to some of remaining terminals of the plurality of terminals 2 and to those terminals, the low power source VSS is supplied. Further, the other remaining terminals of the plurality of terminals 2 are used as input or output signal terminals with the outside and between the signal line thereof and the low power source line 3 or between the signal line thereof and the high power source line, the ESD protection circuit (CDM protection circuit) is provided.

Figure 2:
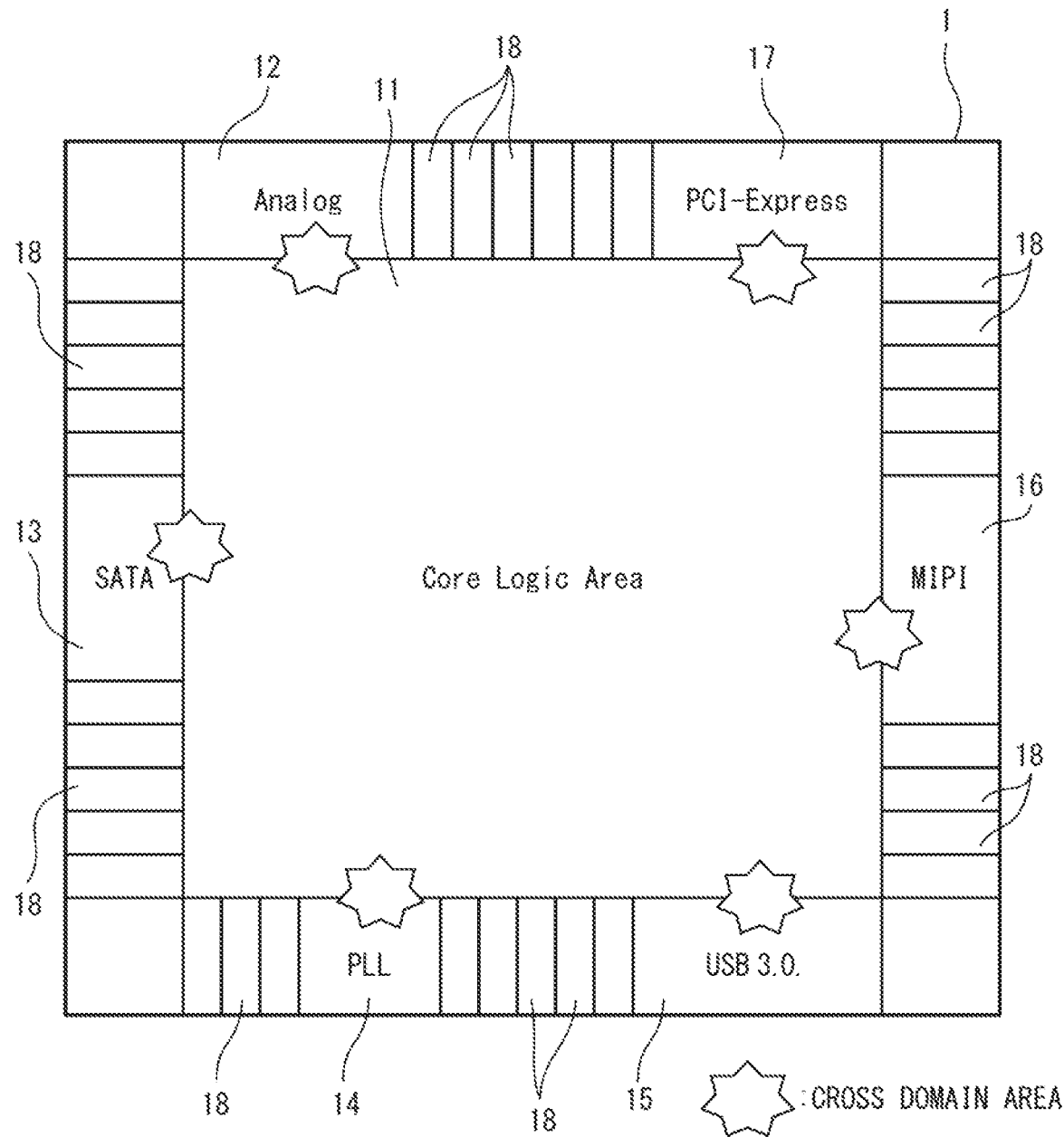
FIG. 2 is a diagram illustrating an example of a plurality of domains that is provided in the semiconductor device.

FIG. 2 is a diagram illustrating an example of a plurality of domains that is provided in the semiconductor device.

The semiconductor device 1 has a core logic area 11, an analog area 12, and a plurality of IF portions (SATA, USB 3.0, MIPI, PCI-Express) 13, 15, 16, and 17 for performing operations in accordance with the input or output specifications. Further, the semiconductor device 1 has a PLL area 14 for performing synchronization with an external clock and a plurality of terminals 18. The analog area 12, the plurality of IF portions (SATA, USB 3.0, MIPI, PCI-Express) 13, 15, 16, and 17, and the PLL area 14 are provided as a function macro at the time of design. The plurality of portions (SATA, USB 3.0, MIPI, PCI-Express) 13, 15, 16, and 17, the analog area 12, and the PLL area 14 input or signals to and from the core logic area 11.

In the core logic area 11, the power source voltage is set by the ASV described previously and the plurality of portions (SATA, USB 3.0, MIPI, PCI-Express) 13, 15, 16, and 17 input/output signals on the power source voltage in accordance with the specifications. The analog area 12 and the PLL area 14 operate on a certain power source voltage. Because of this, it is requested for the power source of the plurality of portions 13, 15, 16, and 17, the analog area 12, and the PLL area 14 to be capable of being set to a voltage at least different from that of the core logic area 11 and the cross domain area where signals are input/output to and from the core circuit on different power source voltages is provided.

Hereinafter, explanation is given by taking the cross domain area between the core logic area 11 and the analog area 12 as an example, but the same explanation also applies between the core logic area 11 and another portion.

Figure 3:
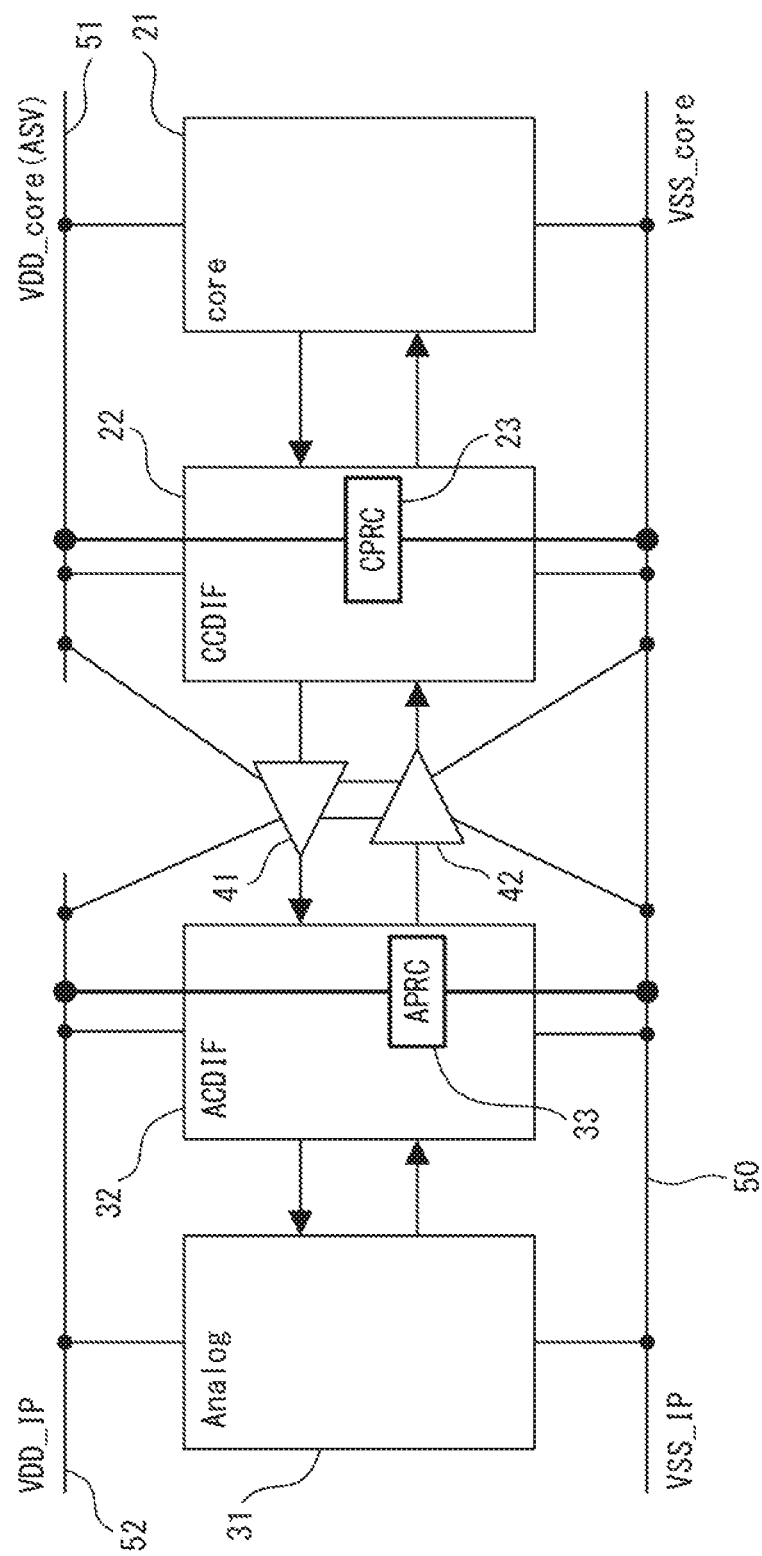
FIG. 3 is a diagram illustrating a common configuration of a cross domain area between a core logic area and an analog area.

FIG. 3 is a diagram illustrating a common configuration of the cross domain area between the core logic area 11 and the analog area 12.

The core logic area 11 has a low (potential) power source line (VSS_core) 50, a high (potential) power source line (VDD_core (ASV)) 51 in the core logic area, a core (core) circuit 21, a core cross domain interface (CCDIF) 22, and a core power rail clamp (CPRC) 23. The analog area 12 has the low power source line (VSS_IP) 50, a high power source line (VDD_IP) 52 in the analog area, an analog (Analog) circuit 31, an analog cross domain interface (ACDIF) 32, and an analog power rail clamp (APRC) 33. As described above, the low power source line (VSS_core) in the core logic area 11 and the low power source line (VSS_IP) in the analog area are in common. The voltage of the low power source line is 0 V and the voltage of the high power source line (VDD_core (ASV)) 51 in the core logic area is set in accordance with the process. The power rail clamp is a widely known circuit and details thereof will be described later. In general, the core circuit 21 is a circuit having a large circuit scale and the circuit scale of the analog circuit 31 small as compared with that of the core circuit 21, and the capacitance between the power sources of the core logic areas 11 is large as compared to the capacitance between the power sources of the analog area 12.

The cross domain area has a first level shifter 41 that converts the level of a digital signal that is output from the CCDIF 22 to the ACDIF 32 and a second level shifter 42 that converts the level of a digital signal that is output from the ACDIF 32 to the CCDIF 22. The first level shifter 41 and the second level shifter 42 are connected to the low power source line 50, the high power source line (VDD_core (ASV)) 51 in the core logic area, and the high power source line (VDD_IP) 52 in the analog area.

The CCDIF 22 receives a level-converted digital signal indicating the results of analog processing and outputs the digital signal to the core circuit 21 as well as outputting a digital signal with which the core circuit 21 controls the analog circuit 31. The ADCIF 32 outputs a digital signal indicating the results of analog processing, which the analog circuit 31 outputs, as well as outputting a level-converted digital signal that controls the analog circuit 31 upon receipt of the digital signal. As described above, the CCDIF 22 and the ADCIF 32 are digital circuits. The analog circuit 31 operates upon receipt of the digital signal that controls the analog circuit 31 and outputs the digital signal indicating the results of analog processing. The analog circuit 31 includes, in accordance with the necessity, an analog comparator, a D/A converter, an A/D converter, etc.

Figure 4:
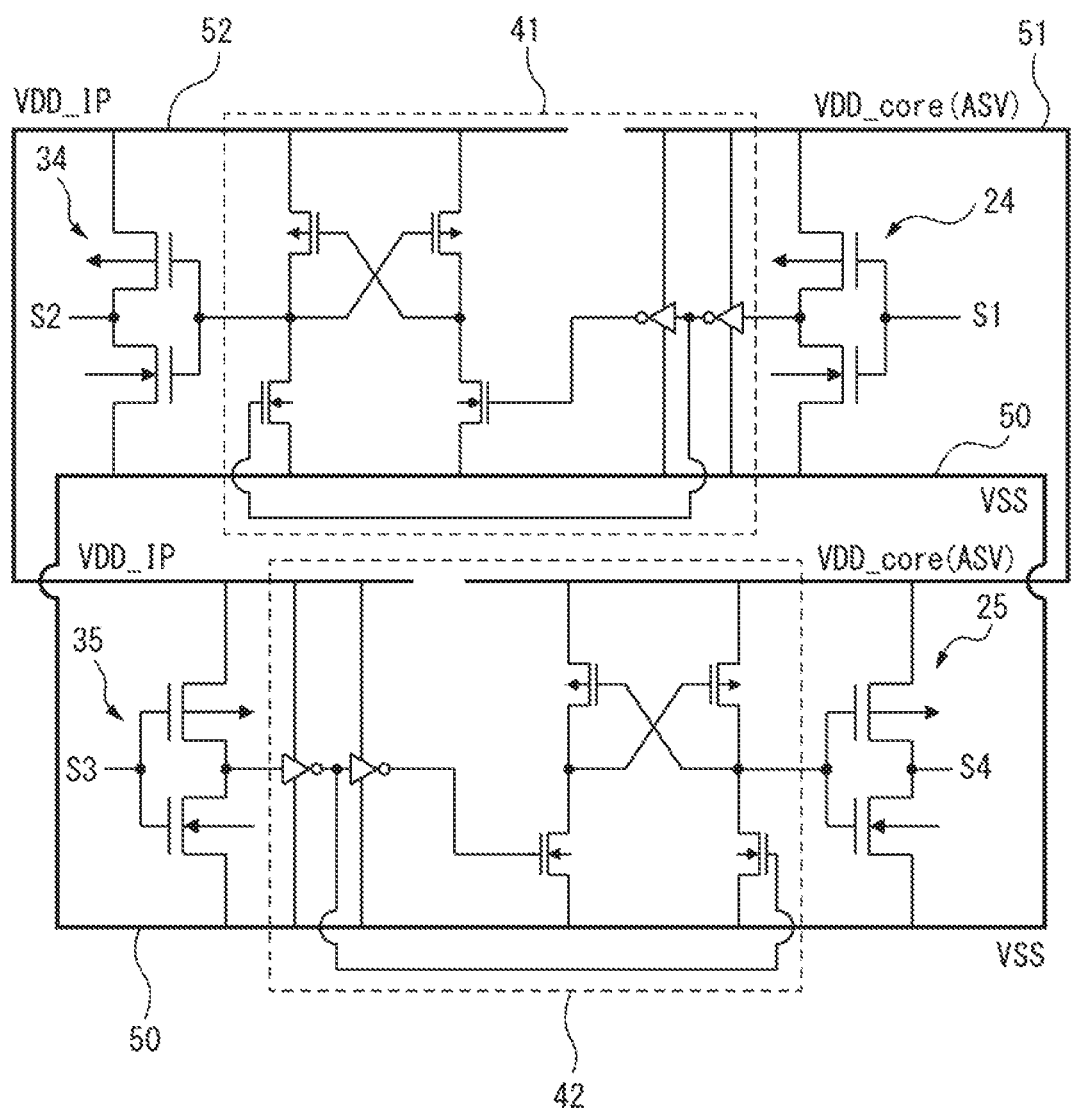
FIG. 4 is a diagram illustrating a circuit configuration example at a transistor level of the cross domain area in FIG. 3.

FIG. 4 is a diagram illustrating a circuit configuration example at a transistor level of the cross domain area in FIG. 3.

The CCDIF 22 has a driver 24 that drives a signal S1 that is output from the core circuit 21 to the analog circuit 31, and a receiver 25 that outputs a signal S4 upon receipt of a signal that is output from the analog circuit 31 to the core circuit 21. The ACDIF 32 has a receiver 34 that outputs a signal S2 upon receipt of a signal that is output from the core circuit 21 to the analog circuit 31, and a driver 35 that drives a signal S3 that is output from the analog circuit 31 to the core circuit 21. The drivers 24 and 35 and the receivers 34 and 35 are each formed by an inverter.

The level shifter 41 has two inverters connected in series in two stages that receive a signal obtained by inverting the signal S1, and a differential amplification circuit. The two inverters are connected between the high power source line 51 in the core logic area and the low power source line 50 and the differential amplification circuit is connected between the high power source line 52 in the analog area and the low power source line 50. Consequently, the output signals of the two inverters are signals that use the voltage of the high power source line (VDD_core (ASV)) 51 in the core logic area as a power source voltage. The differential amplification circuit is a circuit that uses the voltage of the high power source line (VDD_IP) 52 in the analog area as a power source voltage, but operates in accordance with a signal that uses the voltage of the high power source line (VDD_core (ASV)) 51 in the core logic area as a power source voltage. The level shifter 42 has a circuit configuration similar to that of the level shifter 41. The circuit configurations of the level shifters 41 and 42 are widely known, and therefore, more explanation thereof is omitted. As described previously, the ASV appropriately sets the power source voltage of the core logic area to a value less than or equal to a certain value in accordance with the variation in the process. In the following explanation, the analog area is designed with a certain power source voltage (e.g., 1.8 V) and the power source voltage of the core logic area is set to a voltage lower than or equal to 1.8 V and with which desired performance is obtained. Because of this, the withstand voltage of transistors that are arranged in the core logic area, the analog area, and the cross domain area thereof is set to a voltage value higher than or equal to a certain voltage value.

In the configuration example of the cross domain area in FIG. 3, the level shifter is provided, but in the case where the power source voltage of the core logic area and that of the analog are is the same, or the difference therebetween is small, the level shifter is not provided and signals are input and output directly between the CCDIF 22 and the ACDIF 32.

Figure 5A:
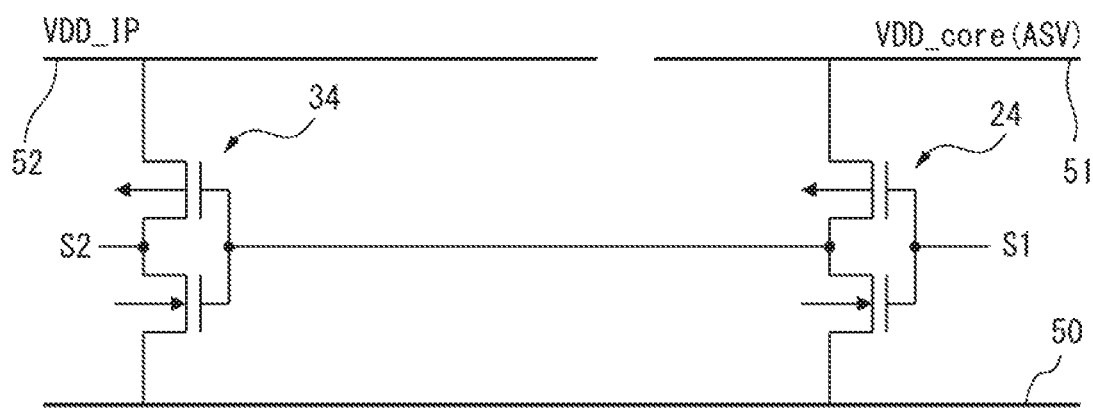
FIGS. 5A and 5B are diagrams each illustrating a configuration example of the cross domain area in the case where signals are input and output directly between a CCDIF and an ACDIF without providing a level shifter in the cross domain area in FIG. 3.
Figure 5B:
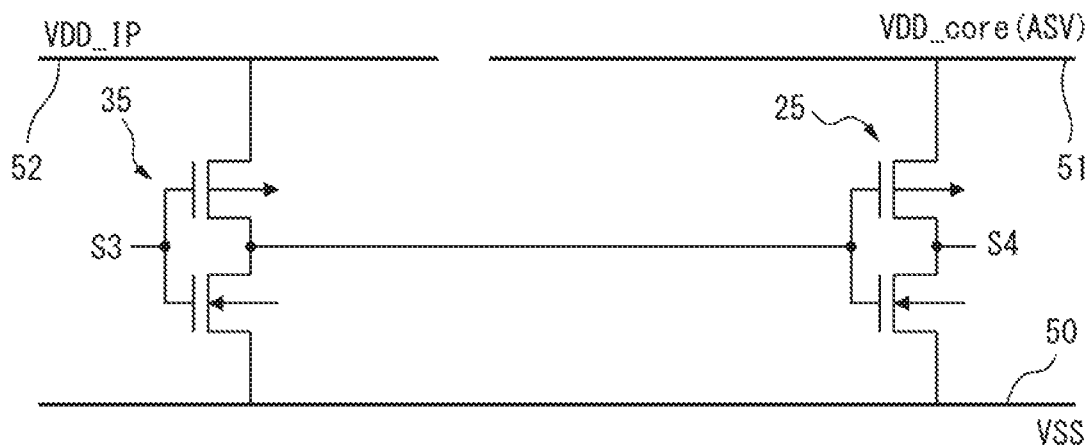

FIG. 5A and FIG. 5B are diagrams each illustrating a configuration example of the cross domain area in the case where signals are input and output directly between the CCDIF 22 and the ACDIF 32 without providing the level shifter in the cross domain area in FIG. 3. FIG. 5A illustrates the portion relating to a signal from the core circuit 21 to the analog circuit 31 and FIG. 5B illustrates a portion relating to a signal from the analog circuit 31 to the core circuit 21. The low power source line 50, the high power source line (VDD_core (ASV)) 51 in the core logic area, and the high power source line (VDD_IP) 52 in the analog area are connected as illustrated in FIG. 4, but here, in order to make schematic representation easier, they are illustrated as in FIG. 5A and FIG. 5B. In the following explanation, the representation method in FIG. 5 is used without explanation.

The circuit in the cross domain area relating to the signal from the core circuit 21 to the analog circuit 31 illustrated in FIG. 5A differs from that in FIG. 4 in that the level shifter is not provided and the output of the driver 24 of the CCDIF 22 is input directly to the receiver 34 of the ACDIF 32. The portion relating to the signal from the analog circuit 31 to the core circuit 21 illustrated in FIG. 5B differs from that in FIG. 4 in that the level shifter is not provided and the output of the driver 35 of the ACDIF 32 is input directly to the receiver 25 of the CCDIF 22.

In the case of the circuit vulnerable to the influence of noise, such as the analog circuit, it is desirable to reduce the influence of noise via the low power source line and the high power source line by separating the low power source lines, not only the high power source lines. In order to separate the low power source lines, the low power source line in a certain domain is not connected to the low power source line in another domain, but the low power source line in each domain is connected to a terminal and 0 V is supplied through the terminal. Between the low power source line and the high power source line in each domain, the ESD protection circuit is connected.

Further, improving the stability of the potential of the low power source line is also performed by connecting the separated low power source lines via a bidirectional diode. In general, the low power source lines connected via a bidirectional diode are also referred to as separate low power source lines and this is also true with the embodiment explained here.

FIG. 6 is a diagram illustrating a configuration in the case where the low power source lines are separated and are connected by a bidirectional diode in the configuration example in FIG. 3.

As illustrated in FIG. 6, the low power source line 50 in FIG. 3 is separated into a low power source line (VSS_core) 53 in the core logic area and a low power source line (VSS_IP) 54 in the analog area and they are connected via a bidirectional diode 55. There is a case where the bidirectional diode 55 is not provided, differing from the above.

Level shifters 61 and 62 correspond to the level shifters 41 and 42 in FIG. 3, but differ in being connected to the high power source line 51 and the low power source line 53 in the core logic area and to the high power source line 52 and the low power source line 54 in the analog area, respectively.

As described previously, the signal path in the cross domain area has such a problem that the element of the signal path is damaged due to the influence of the ESD. In the case where the bidirectional diode 55 is not provided as described above, the influence of the ESD remains. If the bidirectional diode 55 is provided, it is possible to suppress the potential of each of the two low power source lines to about the on-voltage of the diode, but the influence of the ESD still remains, and therefore, there is such a problem that the element of the signal path is damaged. Hereinafter, this problem is explained.

Figure 7:
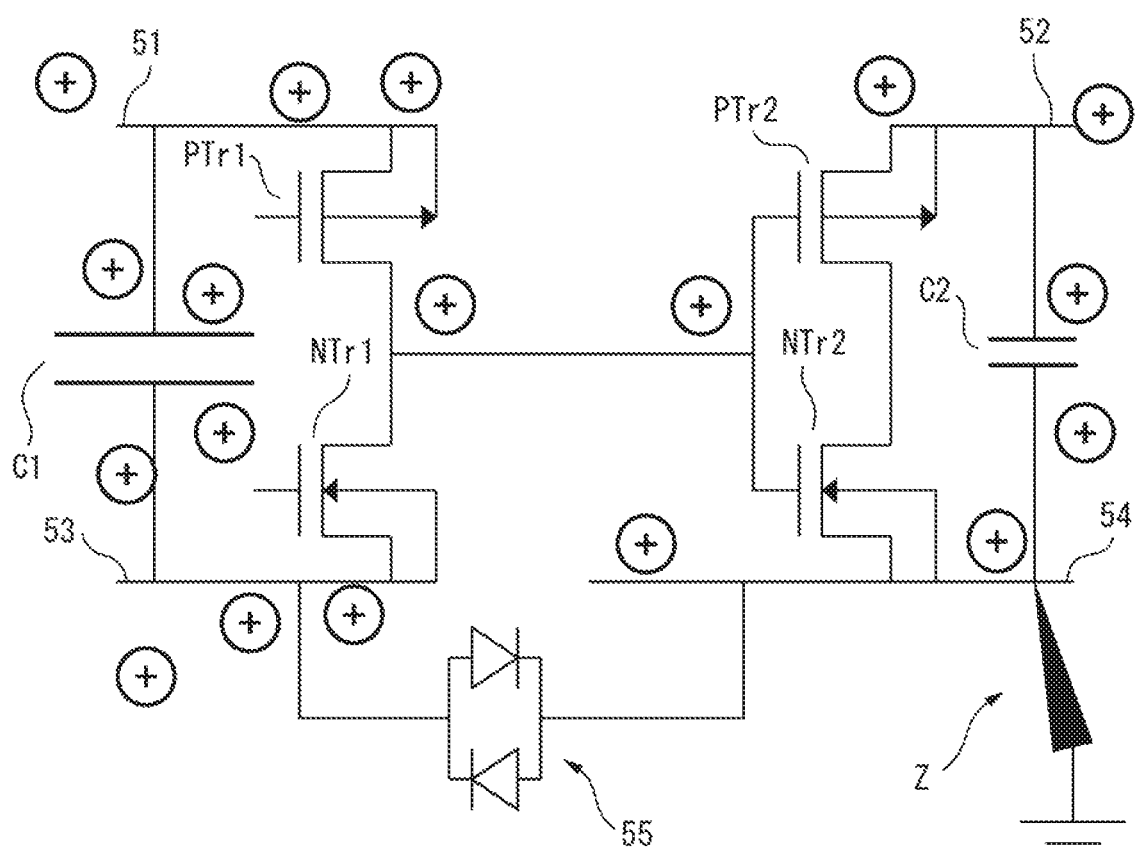
FIGS. 7 to 9 are diagrams explaining such a problem that an element of the signal path in the cross domain area is damaged even by connecting separate low power source lines by the bidirectional diode.
Figure 8:
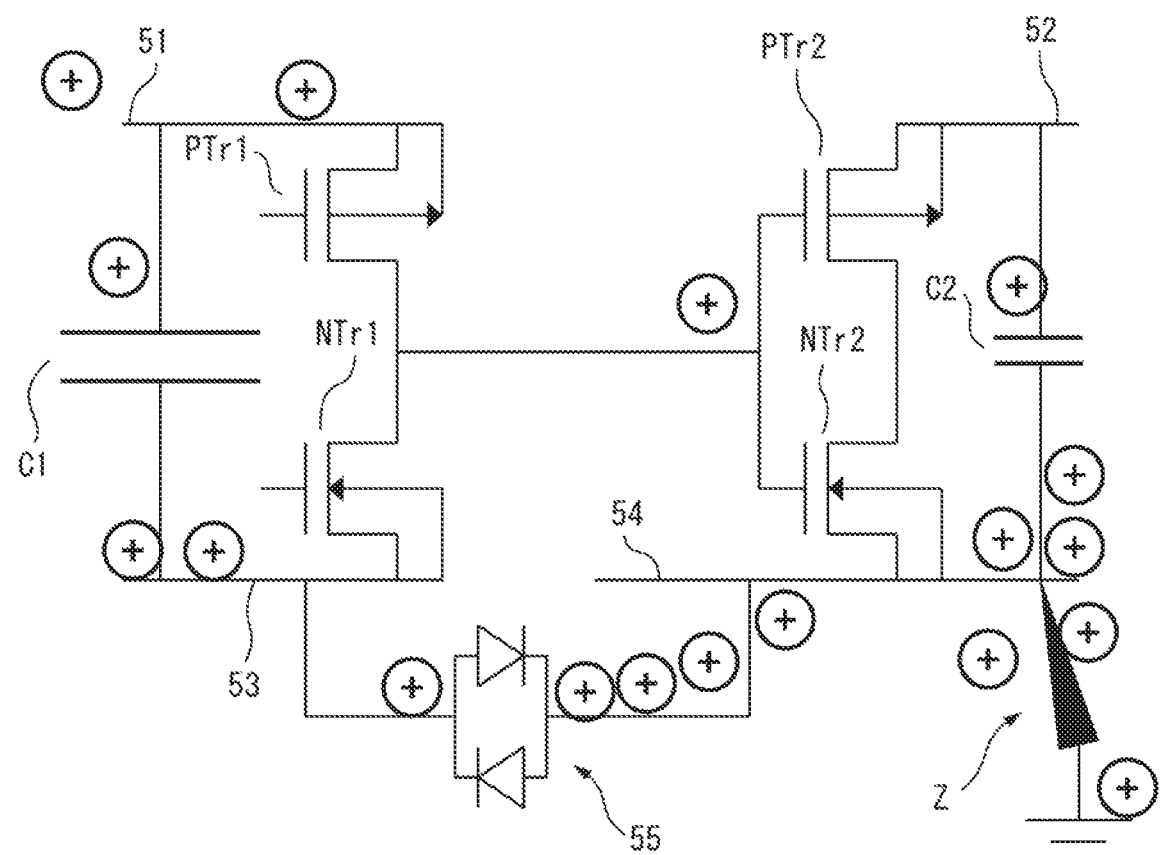
Figure 9:
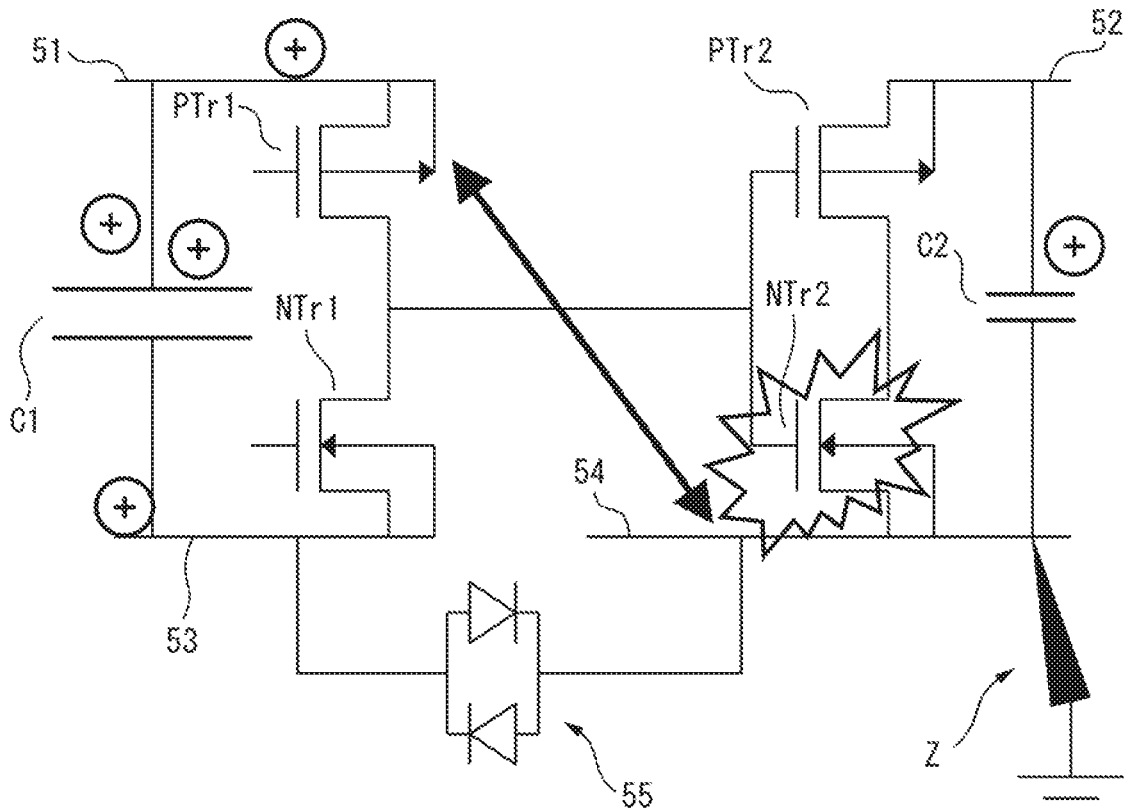

FIG. 7 to FIG. 9 are diagrams explaining such a problem that the element of the signal path in the cross domain area is damaged even by connecting the separate low power source lines by the bidirectional diode. In FIG. 7 to FIG. 9, the configuration in the case where the level shifter in FIG. 5A is not provided is taken as an example.

In general, the number of circuit elements in the core logic area is larger than the number of circuit elements in the analog area and the capacitance between the power sources of the core logic area is larger than the capacitance between the power sources in the analog area. In FIG. 7, this is illustrated in the circuit diagram in which a capacitor C1 corresponding to the capacitance between the power sources of the core logic area is connected between the high power source line 51 and the low power source line 53 in the core logic area and a capacitor C2 corresponding to the capacitance between the power sources in the analog area is connected between the high power source line 52 and the low power source line 54 in the analog area.

It is assumed that the semiconductor device is positively charged and positive charges are accumulated in the high power source line and the low power source line as illustrated in FIG. 7. It is supposed that the terminal to which the low power source line 54 in the analog area is grounded in this state. Then, as illustrated in FIG. 8, the positive charges charged in the semiconductor device begin to flow out to the ground via the low power source line 54 in the analog area. Finally, all the positive charges charged in the semiconductor device flow out to the ground and the potential of the semiconductor device becomes 0 V, but during this period of time, there arises a difference in the distribution of positive charges in accordance with the difference in the capacitance between the power sources. The positive charges in the core area flow to the low power source line 53 in the core logic area via the protection circuit connected between the high power source line 51 and the low power source line 53 and further flow to the low power source line 54 in the analog area via the bidirectional diode 55. At this time, the capacitance of the capacitor C1 is larger than that of the capacitor C2, and therefore, there arises a difference in the time taken for discharge, and a state is brought about where the potential of the core logic area is higher than the potential of the analog area. Because of this, a state is brought about where the potential of the high power source line 51 in the core logic area is higher than the potential of the low power source line 54 in the analog area. Due to this, as illustrated in FIG. 9, a PMOS transistor PTr1 of the driver 24 turns on, and a high voltage is applied to the gate of an NMOS transistor NTr2 of the receiver 34, and therefore, the gate destruction of the NTr2 occurs.

The above explanation is based on the case where the low power source lines are connected by the bidirectional diode, but in the case where the low power source lines are not connected by the bidirectional diode, the charges in the domain the terminal of which is not grounded are discharged via the substrate, and the discharge takes a long time, and therefore, the difference in voltage is likely to become large. Because of this, the destruction of the element is more likely to occur.

The explanation of FIG. 7 to FIG. 9 is given by taking the configuration in the case where the level shifter in FIG. 5A is not provided as an example, but this is also true in the case where the level shifter is provided.

Figure 10:
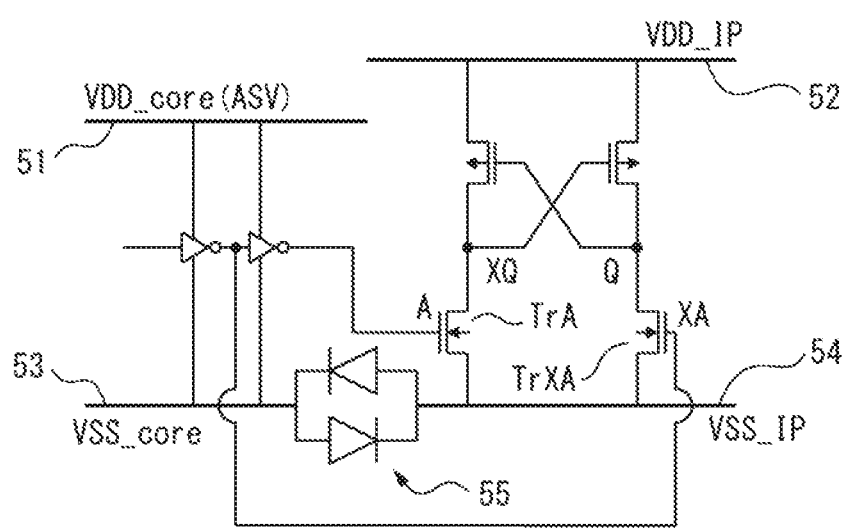
FIG. 10 is a diagram illustrating a configuration example of the level shifter in the configuration example in FIG. 6.

FIG. 10 is a diagram illustrating a configuration example of the level shifter 61 in the configuration example in FIG. 6.

As illustrated in FIG. 10, the level shifter 61 has two inverters connected in series in two stages that receive a signal from the driver 24, and a differential amplification circuit. The two inverters are connected between the high power source line 51 and the low power source line 53 in the core logic area and the differential amplification circuit is connected between the high power source line 52 and the low power source line 54 in the analog area. Consequently, PMOS transistors of the two inverters and NMOS transistors TrA and TrXA of the reception area of the differential amplification circuit are in the same relationship as that between the PTr1 and the NTr2 explained in FIG. 7 to FIG. 9, and therefore, the problem of the gate destruction arises.

As a circuit that protects a transistor from the above-described gate destruction, a discharge clamp circuit is known, which includes a resistor and a discharge transistor and which is provided in the signal line to the gate of the NMOS transistor. This circuit is referred to as a CDM protection circuit because this circuit protects a circuit from the ESD corresponding to the CDM.

Figure 11A:
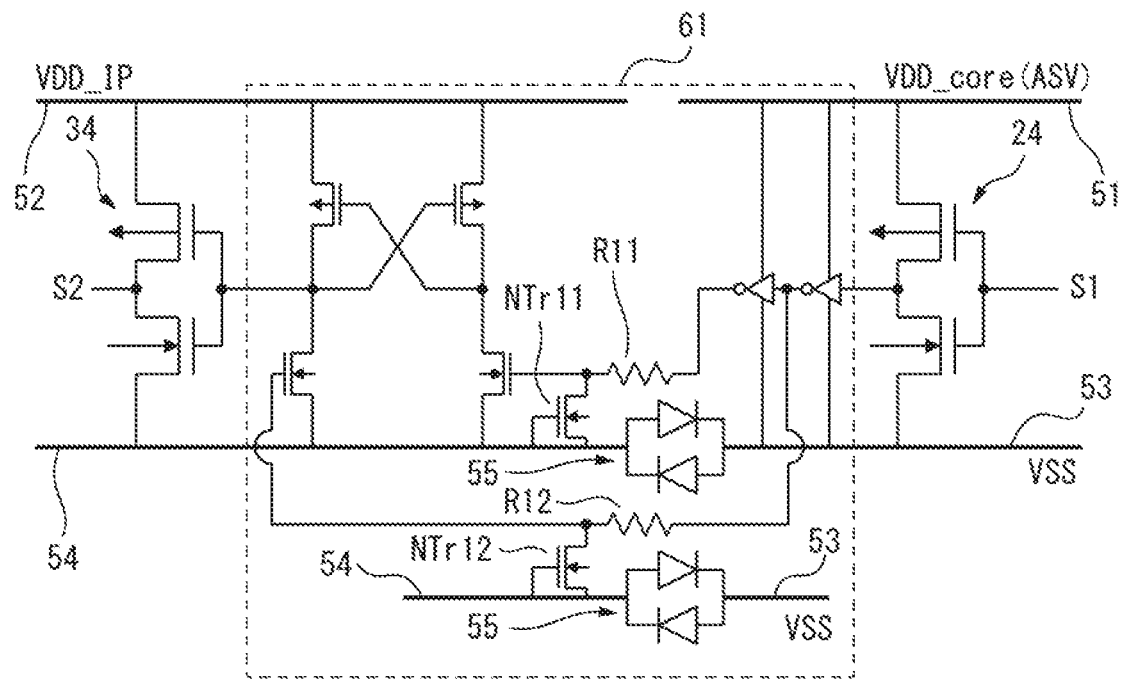
FIGS. 11A and 11B are diagrams each illustrating an example in which a CDM protection circuit is provided in the level shifter in FIG. 6.
Figure 11B:
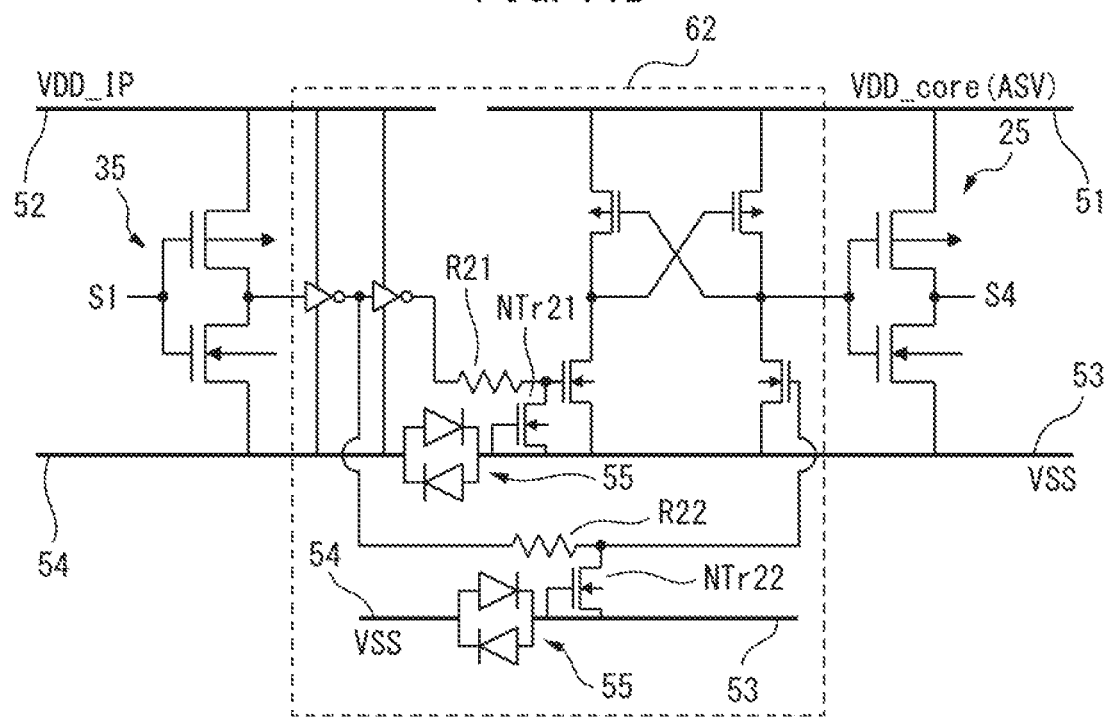

FIG. 11A and FIG. 11B are diagrams each illustrating an example in which the CDM protection circuit is provided in the level shifter in FIG. 6, and FIG. 11A illustrates the level shifter 61 of the signal from the core circuit to the analog circuit and FIG. 11B illustrates the level shifter 62 of the signal from the analog circuit to the core circuit.

As illustrated in FIG. 11A, the level shifter 61 has a differential amplification circuit and a protection circuit is provided in the paths of the gate signal of the two NMOS transistors in the reception area, respectively. Specifically, a protection circuit including a resistor 11 and an NMOS transistor NTr11 and a protection circuit including a resistor R12 and an NMOS transistor NTr12 are provided in the two signal paths from the outputs of the two inverters to the gates of the two NMOS transistors. The R11 and R12 are connected in series to the signal paths, respectively. The NTr11 is connected between the path between the R11 and the gate of the NMOS transistor of the differential amplification circuit and the low power source line 54 in the analog area, and the NTr12 is connected between the path between the R12 and the gate of the NMOS transistor of the differential amplification circuit and the low power source line 54 in the analog area.

Similarly, as illustrated in FIG. 11B, in the level shifter 62, a protection circuit including a resistor R21 and an NMOS transistor NTr21 and a protection circuit including a resistor R22 and an NMOS transistor NTr22 are provided. The R21 and R22 are connected in series to the signal paths, respec- tively. The NTr21 is connected between the path between the R21 and the gate of the NMOS transistor of the differential amplification circuit and the low power source line 53 in the core logic area, and the NTr22 is connected between the path between the R22 and the gate of the NMOS transistor of the differential amplification circuit and the low power source line 53 in the core logic area.

As illustrated in FIG. 11A and FIG. 11B, in the case of a differential signal, two CDM protection circuits are preferable for each signal in the cross domain area and as the number of signals increases, the number of CDM protection circuits increases accordingly. The CDM protection circuit is preferable to be capable of fast discharge and is preferable not to delay a signal to be transmitted. Therefore, the CDM protection circuit has a large area. And the circuit area becomes large if a number of the CDM protection circuits are provided. Further, the level shifters in FIG. 11A and FIG. 11B internally have the bidirectional diode 55, and therefore, the circuit area becomes even larger. The inventor of the present invention has found such a problem that it may be difficult to provide the level shifter as the standard cell in the design system because of the above. Further, the inventor of the present invention has found such a problem that the number of processes increases even in simulation because it is preferable to take into consideration the CDM protection circuit in the cross domain area, and therefore, the simulation becomes complicated. As described above, the inventor of the present invention has found that it may be difficult to provide the CDM protection circuit for each signal path in the cross domain area and that the actual application is difficult.

There is a case where the level shifter is not provided in the configuration example as illustrated in FIG. 6, but a power rail clamp is provided between the high power source line in the domain on one side and the high power source line in the domain on the other side, and between the low power source line in the domain on one side and the low power source line in the domain on the other side. The power rail clamp is a circuit having a large area and is requested to reduce the circuit area.

In a semiconductor device of an embodiment explained below, a protection circuit for ESD protection in the cross domain area is implemented with a small scale (area).

Figure 12:
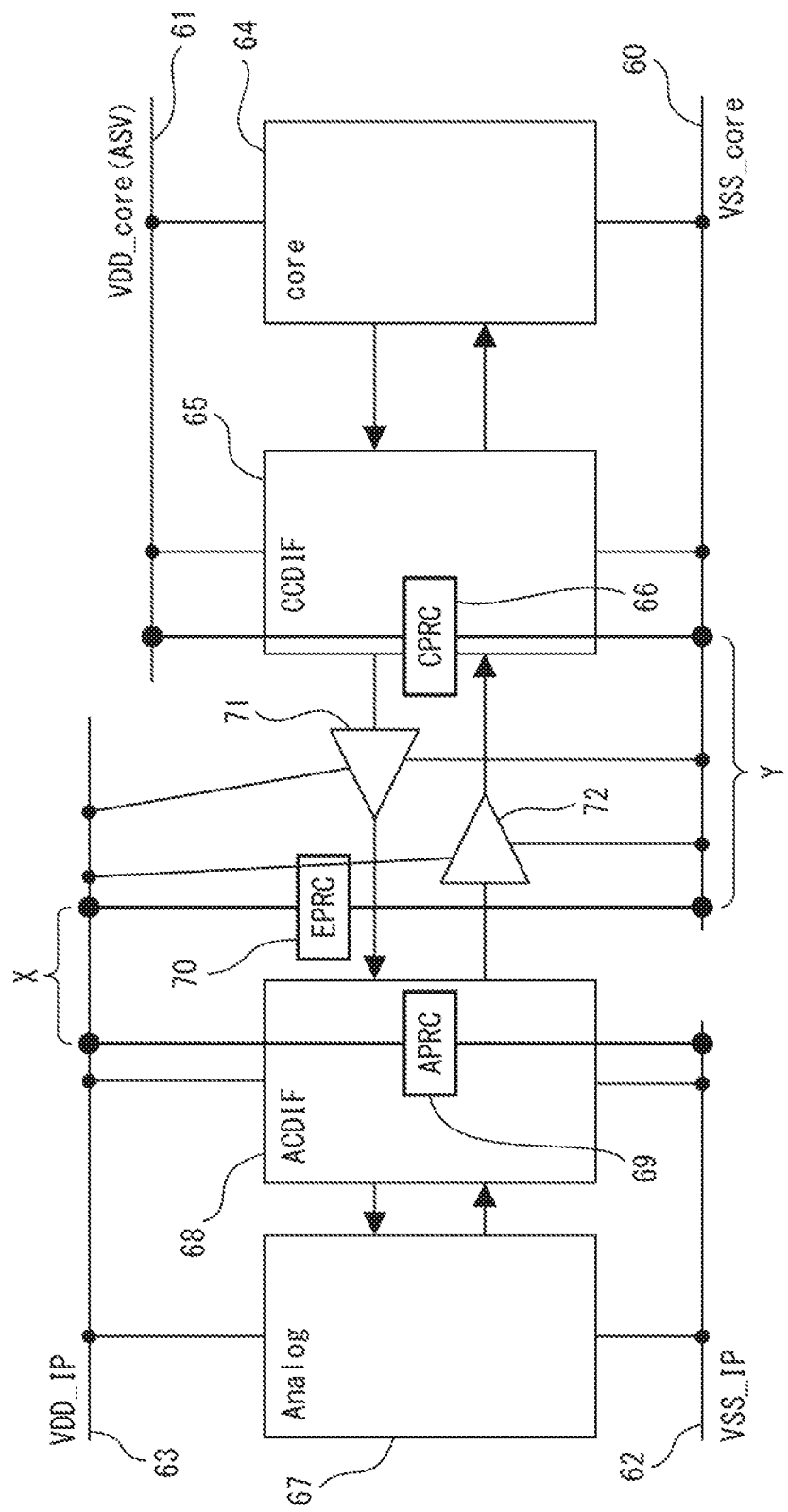
FIG. 12 is a diagram illustrating a configuration of the cross domain area between the core logic area and the analog area in a semiconductor device of a first embodiment.

FIG. 12 is a diagram illustrating a configuration of the cross domain area between the core logic area and the analog area in a semiconductor device of a first embodiment.

The semiconductor device of the first embodiment has a plurality of domains as illustrated in FIG. 1 and the plurality of domains includes the core logic area and the analog area. The power source voltage of the core logic area is appropriately set to a power source voltage lower than or equal to the power source voltage of the analog area in accordance with the variation in the manufacture process. However, the plurality of domains is not limited to the core logic area and the analog area and the core logic area and the analog area are merely exemplary for explanation.

As illustrated in FIG. 12, the logic area has a low (potential) power source line (VSS_core) 60 in the core logic area, the high (potential) power source line (VDD-_core) (ASV)) 61 in the core logic area, a core (core) circuit 64, a core cross domain interface (CCDIF) 65, and a core power rail clamp (CPRC) 66. The analog area has the low power source line (VSS_IP) 62 in the analog area, a high power source line (VDD_IP) 63 in the analog area, an analog (Analog) circuit 67, an analog cross domain interface (ACDIF) 68, and an analog power rail clamp (APRC) 69. The above elements correspond to those explained with reference to FIG. 3, and therefore, explanation thereof is omitted. The number of CPRC 66 and APRC 69 is not limited to one, but a plurality of CPRC 66 and APRC 69 is appropriately arranged between the low power source line and the high power source line.

In the cross domain area, a first relay circuit 71 that relays the output from the CCDIF 65 to the ACDIF 68, a second relay circuit 72 that relays the output from the ACDIF 68 to the CCDIF 65, and an extended power rail clamp (EPRC) 70 are provided.

The low power source line (VSS_core) 60 in the core logic area and the low power source line (VSS_IP) 62 in the analog area are separated. The first relay circuit 71 and the second relay circuit 72 are connected between the high power source line (VDD_IP) 63 in the analog area and the low power source line (VSS_core) 60 in the core logic area and each have a buffer. The EPRC 70 is connected between the high power source line (VDD_IP) 63 in the analog area and the low power source line (VSS_core) 60 in the core logic area. It is desirable that the resistance of a wire (indicated by Y) including the low power source line 60 in the core logic area from the CPRC 66 to the EPRC 70 be at least lower than or equal to 1Ω and be as low as possible. Similarly, it is desirable that the resistance of a wire (indicated by X) including the high power source line 63 in the analog area from the APRC 69 to the EPRC 70 be at least lower than or equal to 1Ω and be as low as possible. Because of this, the first relay circuit 71 and the second relay circuit 72 are connected in the vicinity of the node at which the EPRC 70 of the high power source line 63 in the analog area and the low power source line 60 in the core logic area is connected. It may also be possible to make an attempt to reduce the resistance of the wires indicated by X and Y by forming the wires indicated by X and Y from a metal (e.g., copper or aluminum) wire having a multilayer wire structure of the semiconductor element.

Figure 13A:
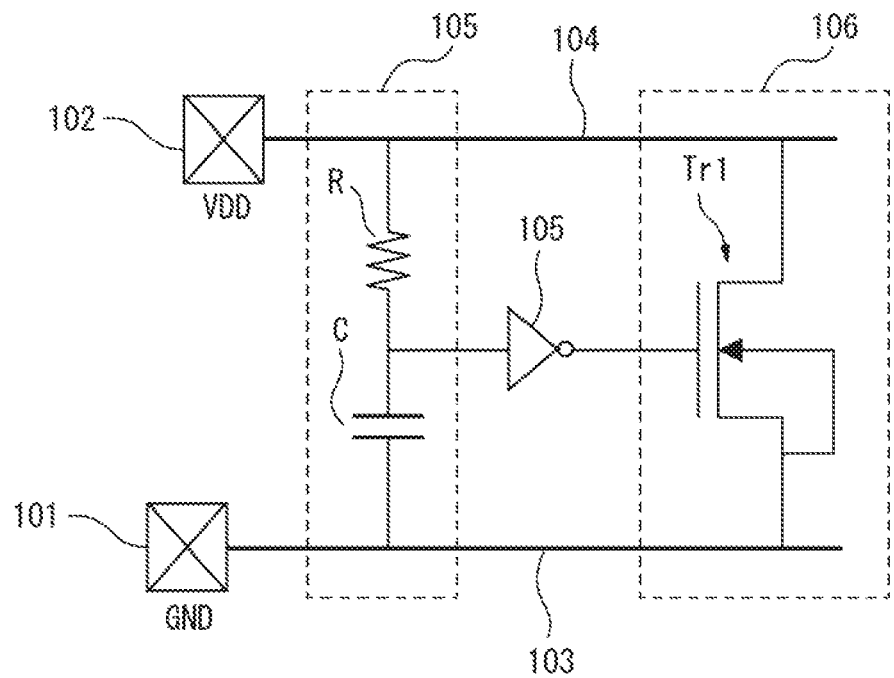
FIGS. 13A and 13B are diagrams each illustrating configuration examples of a CPRC, an APRC 69, and an EPRC 70
Figure 13B:
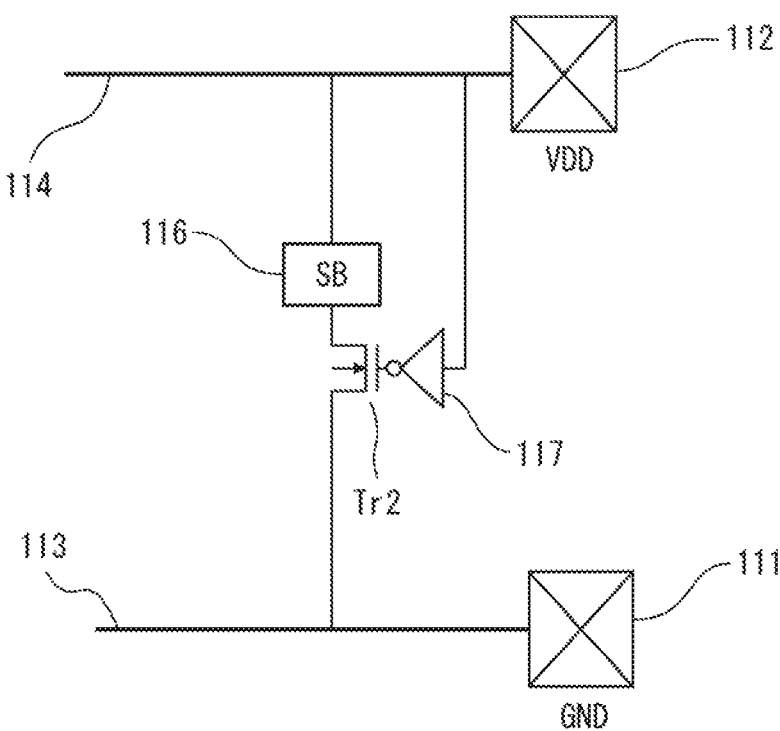

FIG. 13A and FIG. 13B are diagrams illustrating configuration examples of the CPRC 66, the APRC 69, and the EPRC 70 and FIG. 13A illustrates an example of a timed MOSFET type power rail clamp (PRC) and FIG. 13B illustrates an example of a parasitic bipolar type power rail clamp.

The timed MOSFET type power rail clamp is currently used widely and has a resistor/capacitor timer 105, an inverter 105, and a large-area NMOS 106. The resistor/capacitor timer 105 has a capacitor C and a resistor R connected in series between a ground line 103 and a power source line 104. The change in a surge voltage that occurs in the ground line 103 or the power source line 104 via a terminal 101 or a terminal 102 is dulled by the resistor R and the capacitor C. Because of this, in the case of a small surge voltage during the normal operation, the output of the inverter 105 does not change, and it is unlikely that Tr1 of the large-area NMOS 106 is brought into conduction. In contrast to this, if a surge voltage resulting from the ESD occurs, even though the change is dulled by the resistor R and the capacitor C, the input level of the inverter 105 exceeds a threshold value, the output of the inverter 105 changes, and the Tr1 of the large-area NMOS 106 is brought into conduction. Due to this, the surge voltage in the power source line 104 flows to the ground line 103 through the Tr1, and therefore, other circuits are protected.

The parasitic bipolar type power rail clamp has an NMOS Tr2 and a silicide block 116 connected in series between a ground line 113 and a power source line 114, and an inverter 117 that uses the power source line 114 as the input and the output of which is connected to the gate of the Tr2. If a surge voltage occurs in the power source line 114, a parasitic bipolar transistor is formed in the Tr2 and the ESD surge is caused to flow to the ground line 113. The Tr2 is formed by a finger circuit, but there is such a problem that the Tr2 does not operate parallelly at the time of ESD and the current centralizes in a certain protection circuit. In order to avoid this problem, a ballast resistor is used and in the circuit in FIG. 13B, the silicide block 116 is used as a ballast resistor.

The power rail clamp in FIG. 13A and FIG. 13B is a circuit widely known, and therefore, detailed explanation thereof is omitted. Further, the power rail clamp that is used in the present embodiment is not limited to the circuits illustrated in FIG. 13A and FIG. 13B.

Figure 14A:
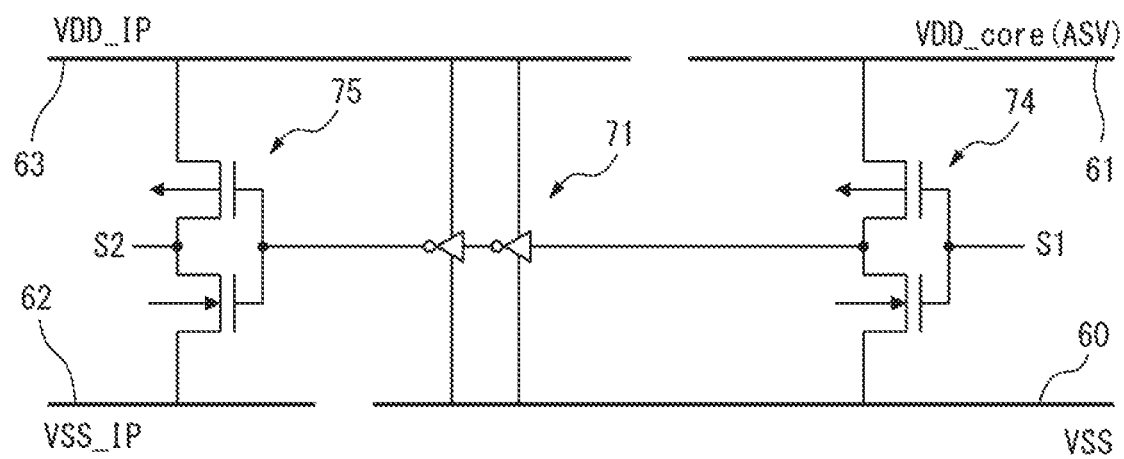
FIG. 14A is a diagram illustrating a configuration of a first relay circuit in the first embodiment.
Figure 14B:
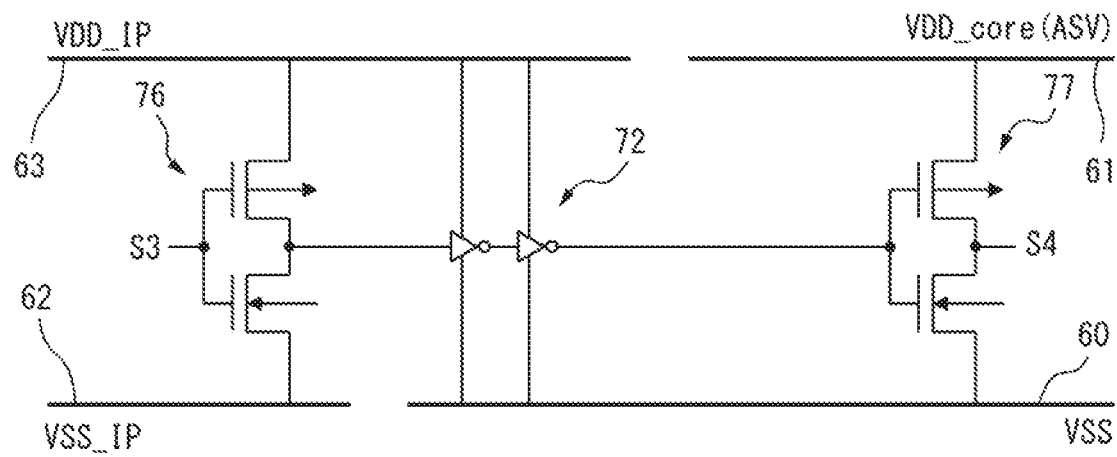
FIG. 14B is a diagram illustrating a configuration of a second relay circuit in the first embodiment.

FIG. 14A and FIG. 14B are diagrams each illustrating a configuration of the first relay circuit 71 and that of the second relay circuit 72 and FIG. 14A illustrates the first relay circuit 71 and FIG. 14B illustrates the second relay circuit 72.

As illustrated in FIG. 14A, the first relay circuit 71 has inverters connected in series in two stages. The two inverters are connected between the high power source line (VDD_IP) 63 in the analog area and the low power source line (VSS_core) 60 in the core logic area and operate by receiving power source supply from the high power source line 63 in the analog area and the low power source line 60 in the core logic area.

As illustrated in FIG. 14B, the second relay circuit 72 has inverters connected in series in two stages. The two inverters are connected between the high power source line (VDD_IP) 63 in the analog area and the low power source line (VSS_core) 60 in the core logic area and operate by receiving power source supply from the high power source line 63 in the analog area and the low power source line 60 in the core logic area.

Although not illustrated in FIG. 14A and FIG. 14B, between the high power source line 61 in the core logic area and the low power source line 60 in the core logic area, the CPRC 66 is connected and between the high power source line 63 in the analog area and the low power source line 62 in the analog area, the APRC 69 is connected as illustrated in FIG. 12. Further, between the high power source line 63 in the analog area and the low power source line 60 in the core logic area, the EPRC 70 is connected.

In the configurations in FIG. 14A and FIG. 14B, even in the case where any of the low power source line 60 in the core logic area, the high power source line 61 in the core logic area, the low power source line 62 in the analog area, and the high power source line 63 in the analog area is grounded, a high voltage is suppressed from being applied to the gate of the transistor, and therefore, it is possible to suppress the gate destruction resulting from the ESD. For example, in the case where the low power source line 60 in the core logic area is grounded, the core circuit 64 and a driver 74 are protected by the CPRC 66 and do not receive a signal directly from the analog area, and therefore, it is possible to suppress the destruction of the transistor. Further, the charges in the high power source line 61 in the core logic area are discharged via the CPRC 66, and therefore, the driver 74 is also suppressed from outputting a high voltage.

The buffer in the first relay circuit 71 is connected to the high power source line 63 in the analog area and the low power source line 60 in the core logic area, but the EPRC 70 is connected therebetween, and therefore, the buffer is protected. Further, the signal that is applied to the gate forming the inverter is the output from the driver 74 and does not become a high voltage, and therefore, a high voltage is suppressed from being applied to the gate. The charges in the high power source line 63 in the analog area are discharged via the EPRC 70, and therefore, the buffer in the first relay circuit 71 is also suppressed from outputting a high voltage. To the gate of the transistor of a receiver 75, the output of the buffer in the first relay circuit 71 is applied, but the output of the buffer is suppressed from becoming a high voltage because the resistance of the wire indicted by X in FIG. 12 is low, and therefore, it is possible to suppress the destruction of the element (transistor).

Further, because the resistance of the wire indicated by X in FIG. 12 is low (e.g., lower than or equal to 1Ω), the charges in the high power source line 63 in the analog area are discharged via the EPRC 70, and therefore, a high voltage is suppressed from being output from a driver 76 and it is possible to suppress the destruction of the transistor of the buffer in the second relay circuit 72. Similarly, because the resistance of the wire indicated by Y in FIG. 12 is low (e.g., lower than or equal to 1Ω), the buffer in the second relay circuit 72 is also suppressed from outputting a high voltage, and therefore, it is possible to suppress the destruction of the transistor of a receiver 77.

As explained above, in the first embodiment, a high voltage is suppressed from being applied to the gate of the transistor by the ESD, and therefore, it is possible to suppress the destruction of the element.

As illustrated in FIG. 12, in the first embodiment, in addition to the CPRC 66 and the APRC 69, the EPRC 70 is connected between the high power source line 63 in the analog area and the low power source line 60 in the core logic area, but no power rail clamp is connected between the high power source line 61 in the core logic area and the low power source line 62 in the analog area. Consequently, it is possible to halve the increased number of power rail clamps having a large area. Further, as compared to the case where the protection circuit is provided for each signal line in the cross domain area, it is possible to considerably reduce the circuit area.

Figure 15:
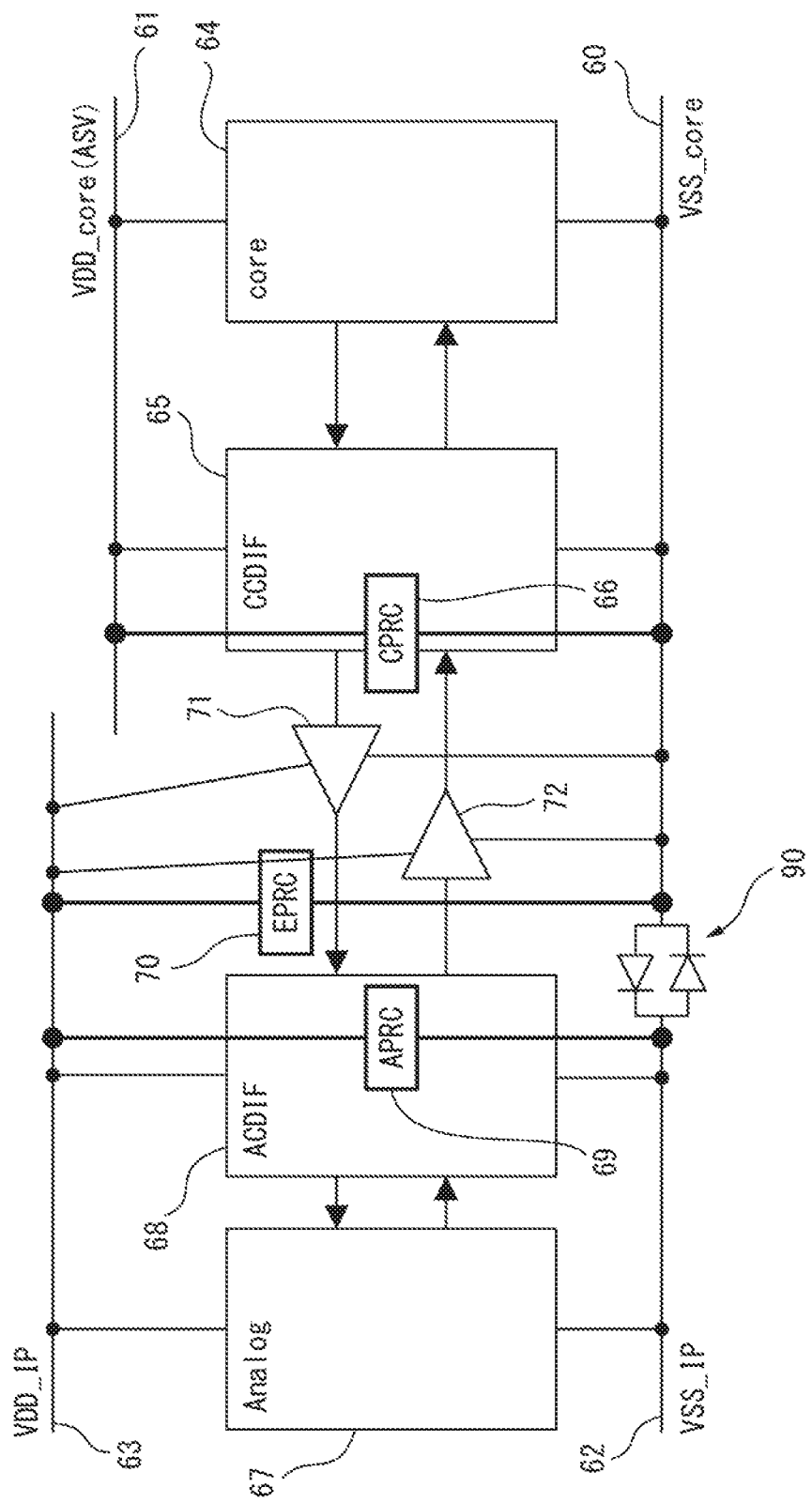
FIG. 15 is a diagram illustrating a configuration of a cross domain area between a core logic area and an analog area in a semiconductor device of a second embodiment.

FIG. 15 is a diagram illustrating a configuration of a cross domain area between a core logic area and an analog area in a semiconductor device of a second embodiment.

The second embodiment differs from the first embodiment in that a bidirectional diode 90 is connected between the low power source line 60 in the core logic area and the low power source line 62 in the analog area and the others are the same. In the second embodiment, the same effects as those in the first embodiment are obtained, and further, the stability of the first low power source line 60 in the core logic area and the low power source line 62 in the analog area improves because the bidirectional diode 90 is provided.

Figure 16:
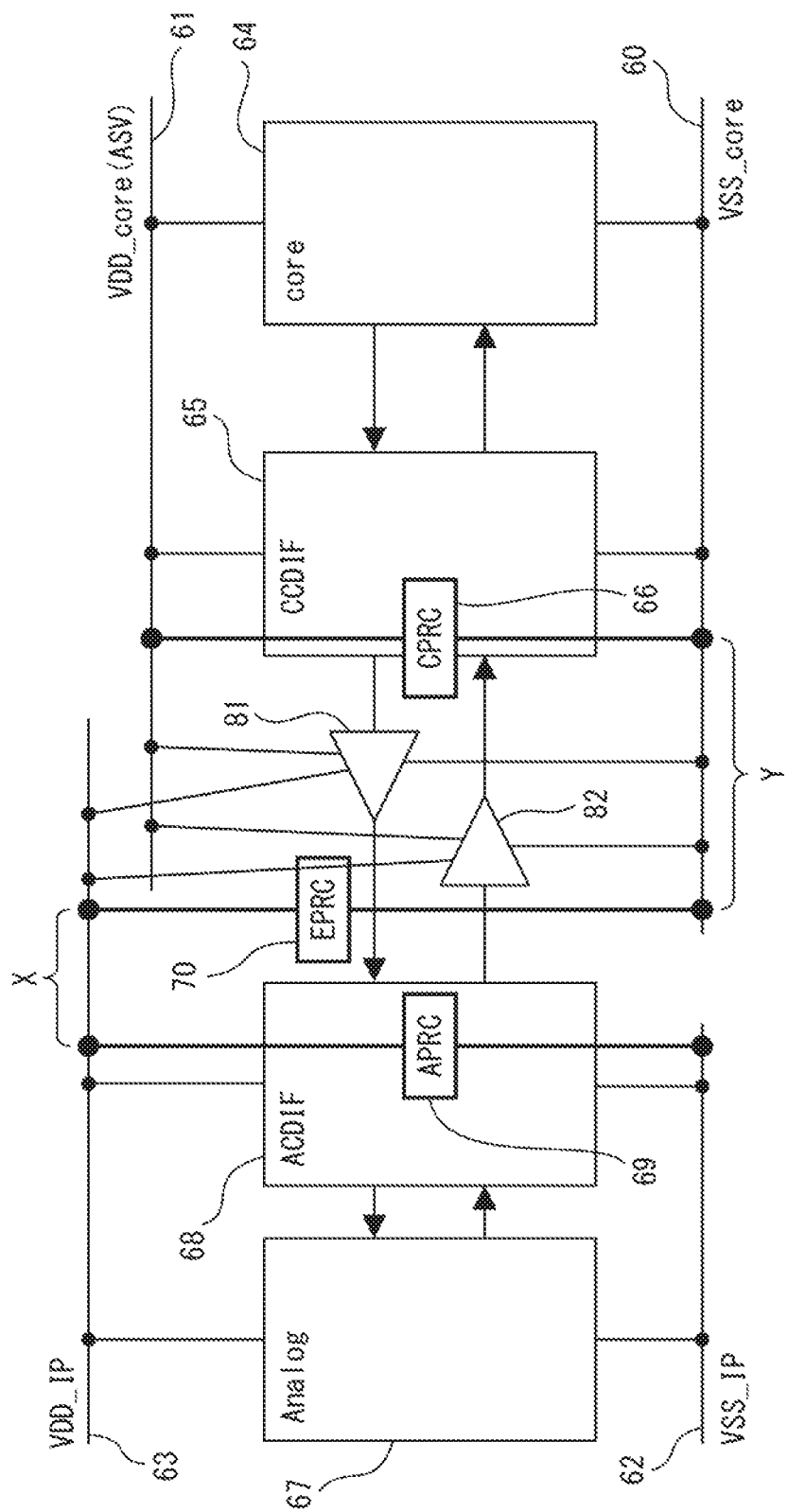
FIG. 16 is a diagram illustrating a configuration of a cross domain area between a core logic area and an analog area in a semiconductor device of a third embodiment.

FIG. 16 is a diagram illustrating a configuration of a cross domain area between a core logic area and an analog area in a semiconductor device of a third embodiment.

The third embodiment differs from the first embodiment in that a first level shifter 81 and a second level shifter 82 are provided in place of the first relay circuit 71 and the second relay circuit 72 and the others are the same.

The first level shifter 81 and the second level shifter 82 are connected to the high (potential) power source line (VDD_core (ASV)) 61 in the core logic area, the high power source line (VDD_IP) 63 in the analog area, and the low power source line (VSS_core) 60 in the core logic area, and operate by receiving power source supply therefrom.

Figure 17A:
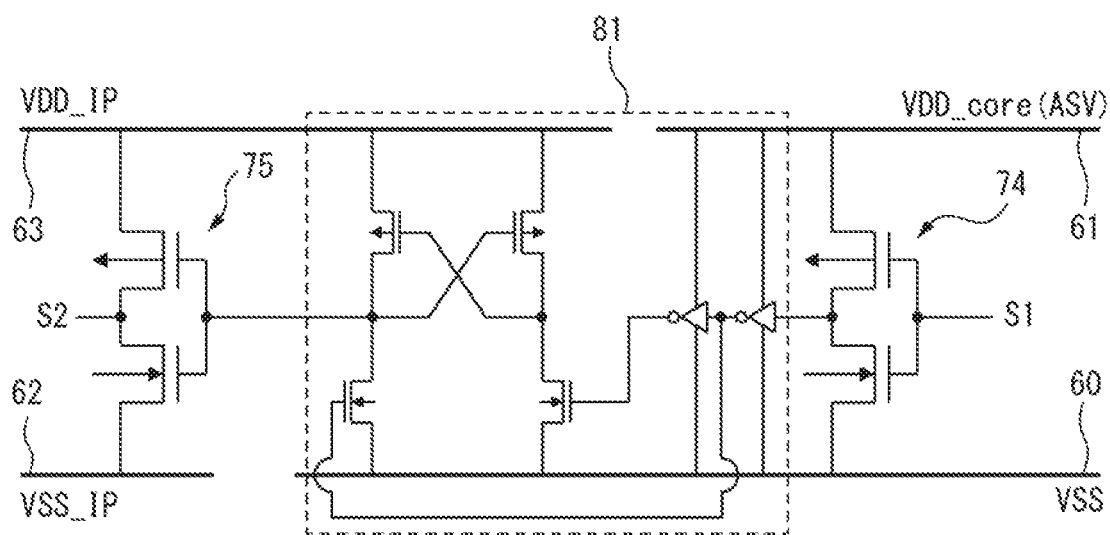
FIG. 17A is a diagram illustrating a configuration of a first level shifter in the third embodiment.
Figure 17B:
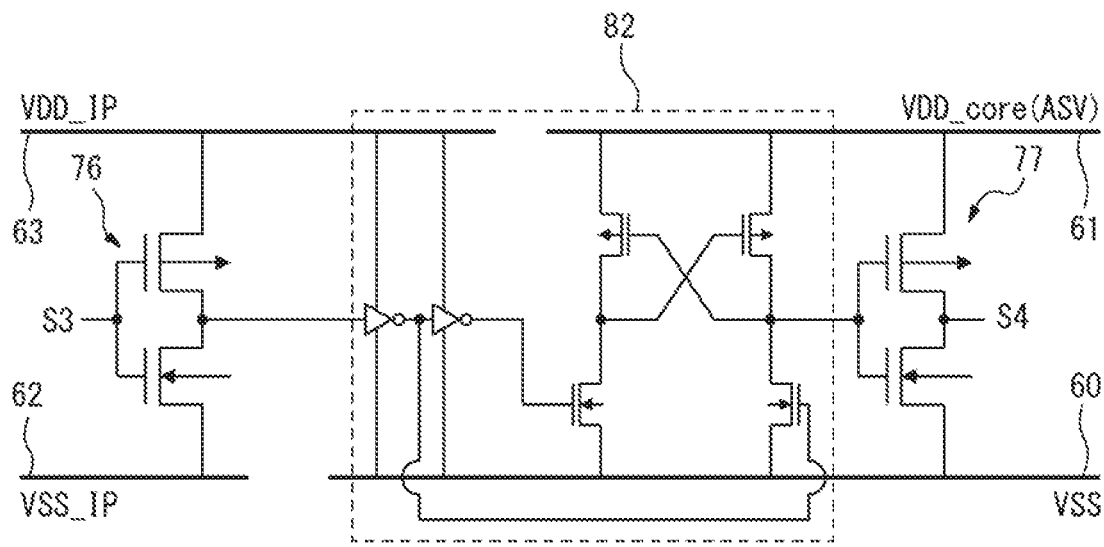
FIG. 17B is a diagram illustrating a configuration of a second level shifter in the third embodiment.

FIG. 17A and FIG. 17B are diagrams each illustrating a configuration of the first level shifter 81 and that of the second level shifter 82 and FIG. 17A illustrates the first level shifter 81 and the FIG. 17B illustrates the second level shifter 82.

As illustrated in FIG. 17, the first level shifter 81 has inverters connected in series in two stages and a differential amplification circuit. The two inverters are connected between the high (potential) power source line (VDD_core (ASV)) 61 in the core logic area and the low power source line (VSS_core) 60 in the core logic area, and operate by receiving power source supply from the high power source line 61 in the core logic area and the low power source line 60 in the core logic area. The differential amplification circuit is connected between the high power source line (VDD_IP) 63 in the analog area and the low power source line (VSS_core) 60 in the core logic area, and operates by receiving power source supply from the high power source line 63 in the analog area and the low power source line 60 in the core logic area.

As illustrated in FIG. 17B, the second level shifter 82 has inverters connected in series in two stages and a differential amplification circuit. The two inverters are connected between the high power source line (VDD_IP) 63 in the analog area and the low power source line (VSS_core) 60 in the core logic area, and operate by receiving power source supply from the high power source line 63 in the analog area and the low power source line 60 in the core logic area. The differential amplification circuit is connected between the high (potential) power source line (VDD_core (ASV)) 61 in the core logic area and the low power source line (VSS_core) 60 in the core logic area, and operates by receiving power source supply from the high power source line 61 in the core logic area and the core power source line 60 in the core logic area.

Although not illustrated schematically, between the high power source line 61 in the core logic area and the low power source line 60 in the core logic area, the CPRC 66 is connected and between the high power source line 63 in the analog area and the low power source line 62 in the analog area, the APRC 69 is connected as illustrated in FIG. 16. Further, between the high power source line 63 in the analog area and the low power source line 60 in the core logic area, the EPRC 70 is connected.

In the configurations in FIG. 17A and FIG. 17B, even in the case where any of the low power source line 60 in the core logic area, the high power source line 61 in the core logic area, the low power source line 62 in the analog area, and the high power source line 63 in the analog area is grounded, a high voltage is suppressed from being applied to the gate of the transistor, and therefore, it is possible to suppress the gate destruction resulting from the ESD. This is the same as that explained in the first embodiment and is explained in a fourth embodiment again, and therefore, detailed explanation thereof is omitted.

Figure 18:
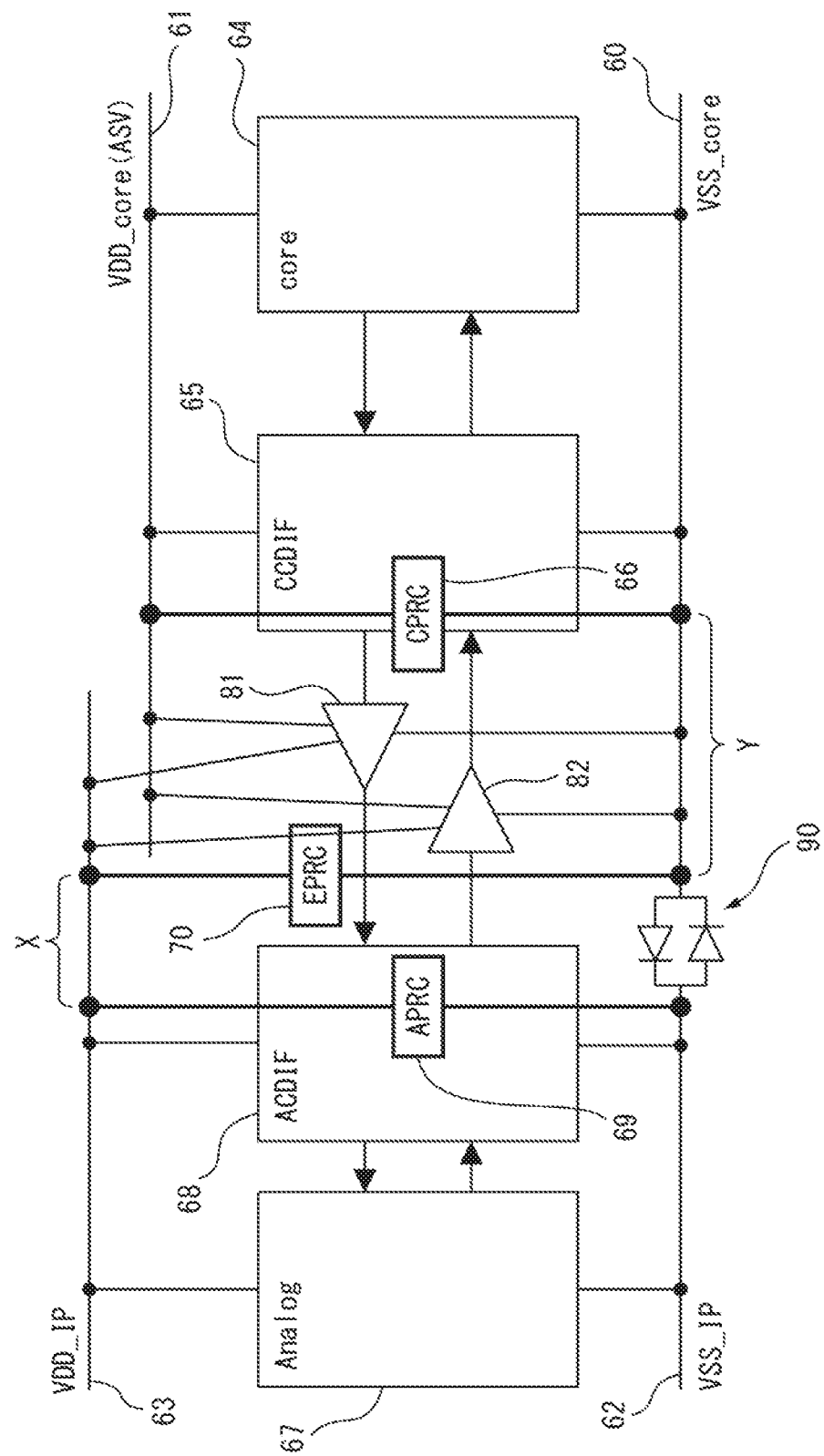
FIG. 18 is a diagram illustrating a configuration of a cross domain area between a core logic area and an analog area in a semiconductor device of a fourth embodiment.

FIG. 18 is a diagram illustrating a configuration of a cross domain area between a core logic area and an analog area in a semiconductor device of the fourth embodiment.

The fourth embodiment differs from the third embodiment in that the bidirectional diode 90 is connected between the low power source line 60 in the core logic area and the low power source line 62 in the analog area and the others are the same. In the fourth embodiment, the bidirectional diode 90 is provided, and therefore, the stability of the first low power source line 60 in the core logic area and the low power source line 62 in the analog area improves than the third embodiment.

Figure 19A:
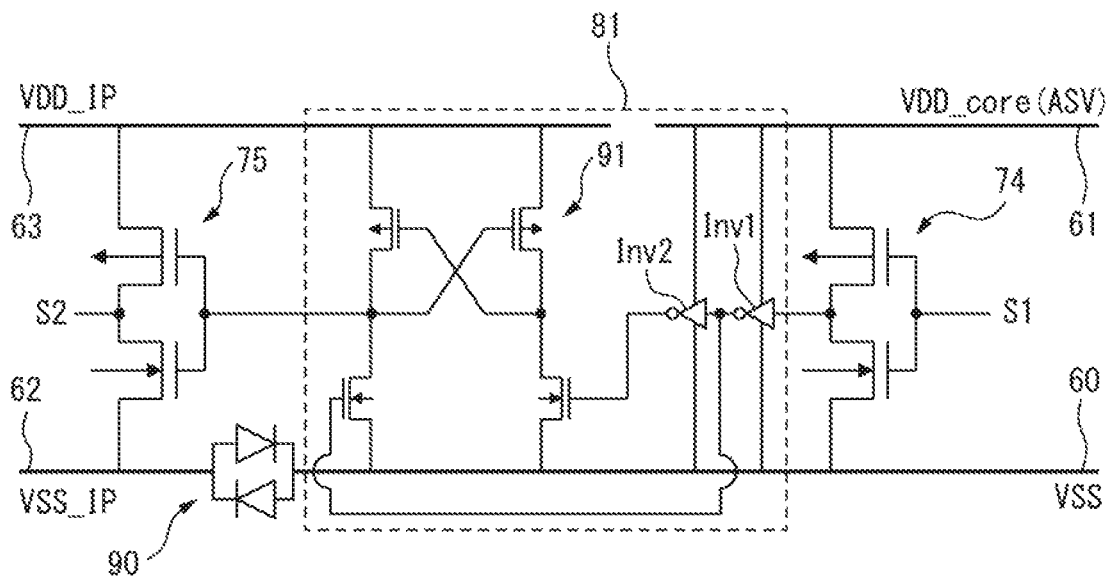
FIG. 19A is a diagram illustrating a configuration of a first level shifter in the fourth embodiment.
Figure 19B:
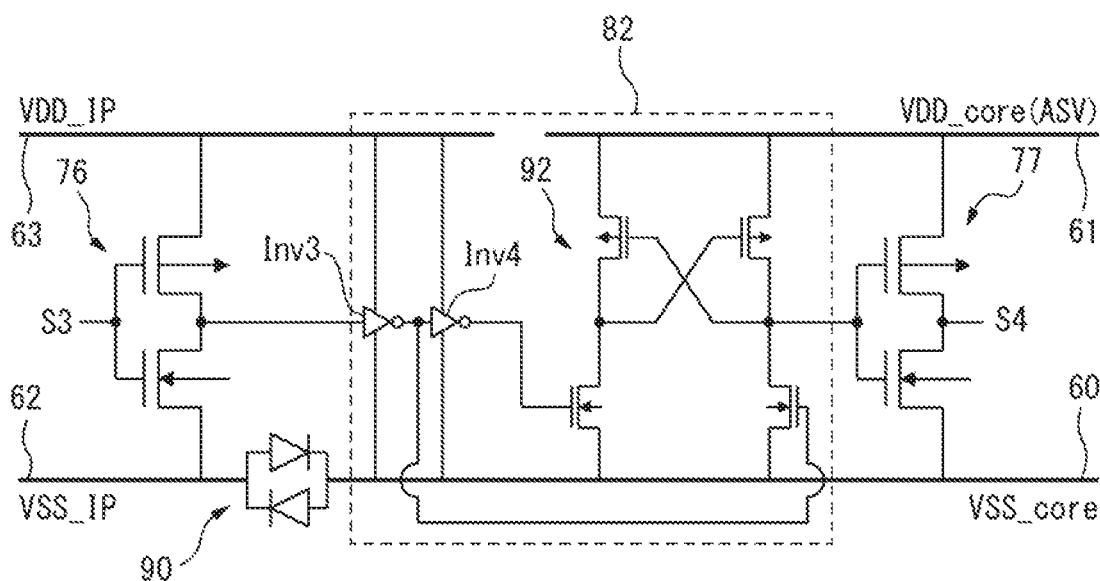
FIG. 19B is a diagram illustrating a configuration of a second level shifter in the fourth embodiment.

FIG. 19A and FIG. 19B are diagrams each illustrating a configuration of the first level shifter 81 and that of the second level shifter 82 and FIG. 19A illustrates the first level shifter 81 and FIG. 19B illustrates the second level shifter 82.

FIG. 19A and FIG. 19B differ from FIG. 17A and FIG. 17B in that the bidirectional diode 90 is connected between the low power source line 60 in the core logic area and the low power source line 62 in the analog area.

FIG. 20A and FIG. 20B are diagrams explaining the flow of charge by the ESD when the low power source line 60 in the core logic area is grounded in the fourth embodiment, and FIG. 20A illustrates the flow of charge in the core logic area and in the first level shifter and FIG. 20B illustrates the flow of charge in the analog area and in the second level shifter.

First, a case where the CPRC 66, the APRC 69, and the EPRC 70 are not provided is considered. In this case, if a node N1 of the low power source line 60 in the core logic area is grounded, as indicated by a broken line in FIG. 20A, charges on the side of the high power source line 61 in the core logic area discharge through the transistor in the circuit forming the core logic area. Among the charges, charges that charge through Inv1 and Inv2 of the first level shifter 81 flow to the low power source line 60 in the core logic area via an NMOS transistor NTr3 and an NMOS transistor NTr32 in the reception area of the differential amplification circuit of the first level shifter 81. In this case, a high voltage is applied to the gates of the NTr31 and the NTr32 as a result. Because of this, by providing the CPRC 66, the charges on the side of the high power source line 61 in the core logic area are caused to discharge via the CPRC 66 without passing through the transistor in the circuit forming the core logic unit when the node N1 of the low power source line 60 in the core logic area is grounded. In view of a case where the low power source line 62 in the analog area is grounded, the APRC 69 is also preferably provided. As described above, the power rail clamp that is provided in each domain is preferable so that the discharge in each domain does not take place through the transistor in the circuit within the domain.

Next, a case where the CPRC 66 and the APRC 69 are provided but the EPRC 70 is not provided is considered. In this case, if the node N1 of the low power source line 60 in the core logic area is grounded, as indicated by a broken line in FIG. 20B, charges on the side of the high power source line 63 in the analog area discharge through the transistor in the circuit forming the analog area and Inv3 of the second level shifter. Besides this, charges on the side of the high power source line 63 in the analog area are applied to the gate of the NMOS transistor in the reception area of the differential amplification circuit through the Inv3 and Inv4 of the second level shifter, and therefore, the gate is destroyed. If the EPRC 70 is provided, the charges on the side of the high power source line 63 in the analog area discharge through the EPRC 70, and therefore, it is possible to suppress the destruction of the transistor.

Figure 21:
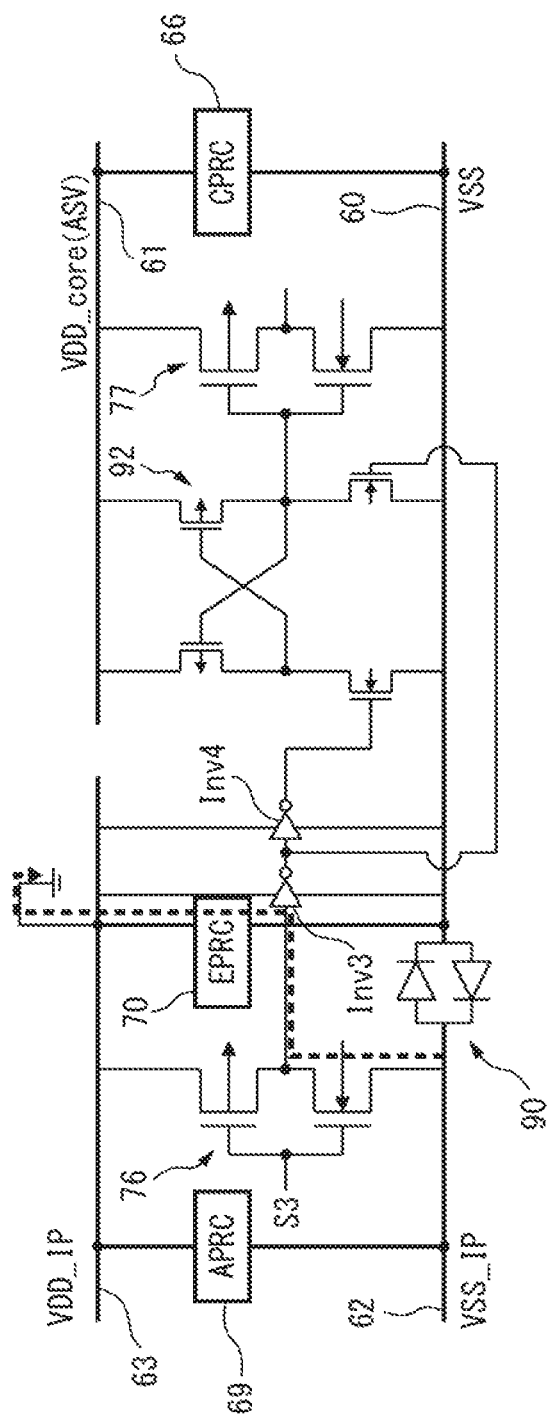
FIG. 21 is a diagram explaining the flow of charge in the analog area and in the second level shifter by the ESD when a high power source line in the analog area is grounded.

FIG. 21 is a diagram explaining the flow of charge in the analog area and in the second level shifter by the ESD when the high power source line 63 in the analog area is grounded.

The low power source line 60 in the core logic area is connected to the high power source line 63 in the analog area via the EPRC 70, and the high power source line 61 in the core logic area is connected to the high power source line 63 in the analog area via the CPRC 66, the low power source line 60 in the core logic area, and the EPRC 70. Further, the resistance of the wire indicated by Y in FIG. 18 is low (e.g., lower than or equal to 1Ω). Because of this, charges on the side of the low power source line 60 in the core logic area and charges on the side of the high power source line 61 in the core logic area are discharged via the EPRC 70 and the CPRC 66 and a high voltage is suppressed from being applied to the gate of the transistor, and therefore, it is possible to suppress the destruction of the transistor.

In the case where the APRC 69 is not provided, there is possibility that charges on the side of the low power source line 60 in the analog area flow in a path that leads to the high power source line 63 in the analog area via the NMOS transistor of the driver 76 and the Inv3 of the second level shifter 82. However, by reducing the resistance of the wire indicted by X in FIG. 18 (e.g., lower than or equal to 1Ω) by providing the APRC 69, charges on the side of the low power source line 60 in the analog area flow to the high power source line 63 in the analog area via the APRC 69, and therefore, it is possible to suppress the destruction of the transistor forming the circuit.

Figure 22A:
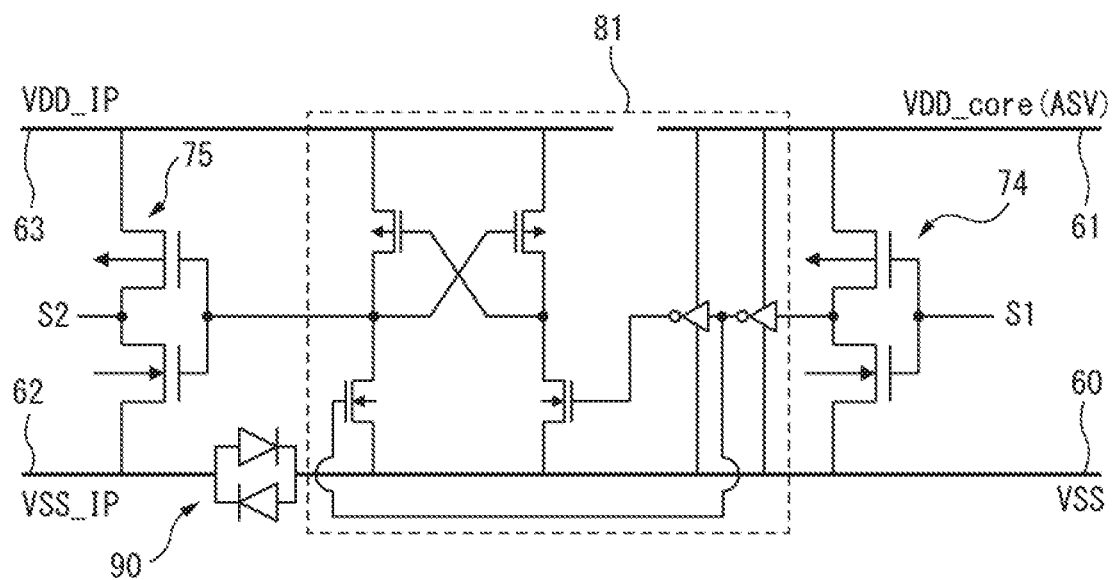
FIG. 22A and FIG. 22B are diagrams each illustrating configurations of a cross domain area between a core logic area and an analog area in a semiconductor device in modification examples of the fourth embodiment.
Figure 22B:
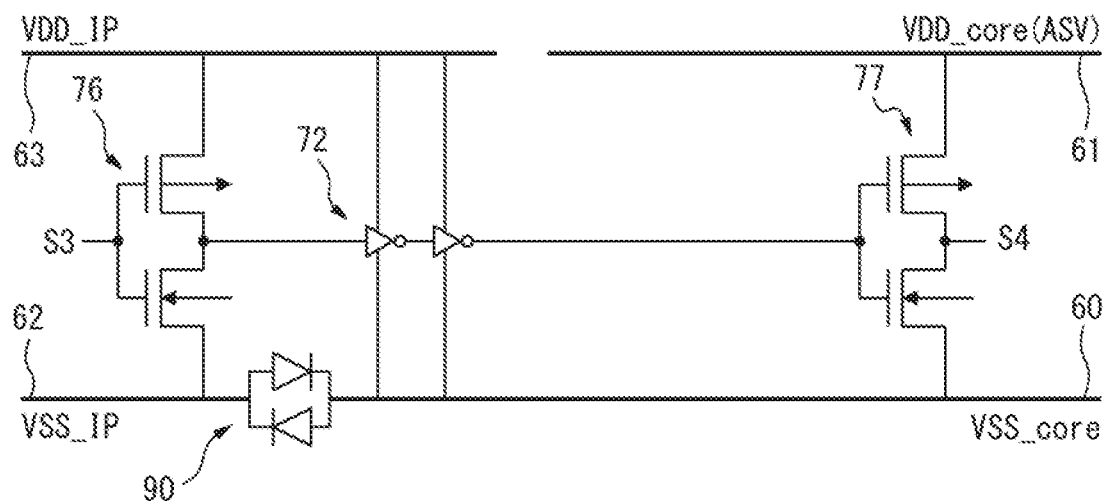

FIG. 22A and FIG. 22B are diagrams each illustrating configurations of a cross domain area between a core logic area and an analog area in a semiconductor device in modification examples of the fourth embodiment, and FIG. 22A illustrates the configuration of the first level shifter and FIG. 22B illustrates the configuration of the second relay circuit.

The modification examples illustrated in FIG. 22A and FIG. 22B are those in which the second level shifter 82 is replaced with the second relay circuit 72 of the second embodiment in the fourth embodiment and the first level shifter 81 is left as it is. The combination such as this may be accepted. Detailed explanation thereof is omitted.

As above, by taking the two domains of the core logic area and the analog area as an example, the embodiments in the case where both the low power source lines and the high power source lines in the domain are separated (including the case where both the low power source lines and the high power source lines are connected by the bidirectional diode) and the signal in the cross domain area is transmitted by the buffer or the level shifter are explained. The present invention is not limited to those embodiments and it is possible to apply the present invention to any combination of the domains.

As described above, in the semiconductor device of the embodiments, favorable ESD protection in the cross domain area is implemented with a small protection circuit.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device comprising:
   a first domain configured to include a first high power source line, and a first low power source line;
   a second domain configured to include a second high power source line separated from the first high power source line, and a second low power source line separated from the first low power source line;
   a first relay circuit configured to receive a signal from the first domain and output the signal to the second domain, and
   a second relay circuit configured to receive a signal from the second domain and output the signal to the first domain, wherein
   the first relay circuit includes a first differential circuit connected to the second high power source line and the first low power source line, and
   the second relay circuit includes a second differential circuit connected to the first high power source line and the first low power source line.

2. The semiconductor device according to claim 1, wherein
the first relay circuit includes a first inverter that is connected to the first high power source line and the first low power source line, and
the first differential circuit receives a signal from the first inverter.

3. The semiconductor device according to claim 2, wherein
the second relay circuit includes a second inverter that is connected to the second high power source line and the first low power source line, and
the second differential circuit receives a signal from the second inverter.

4. The semiconductor device according to claim 3, wherein
the first differential circuit includes a first transistor, a second transistor, a third transistor and a fourth transistor,
the first transistor is provided between the first low power source line and the second transistor,
a gate of the first transistor is connected to the first inverter,
the second transistor is provided between the first transistor and second high power source line,
a gate of the second transistor is connected to the third transistor and the fourth transistor,
the third transistor is provided between the first low power source line and the fourth transistor,
the fourth transistor is provided between the third transistor and second high power source line, and
a gate of the fourth transistor is connected to the first transistor and the second transistor.

5. The semiconductor device according to claim 4, wherein
the first relay circuit includes a third inverter,
the first inverter receives a signal from the third inverter, and
a gate of the third transistor is connected to the third inverter.

6. The semiconductor device according to claim 1, further comprising a bidirectional diode between the first lower power source line and the second lower power source line.

7. The semiconductor device according to claim 1, further comprising a first power clamp circuit provided between the first high power source line and the first low power source line in the first domain.

8. The semiconductor device according to claim 7, further comprising a second power clamp circuit provided between the second high power source line and the second low power source line in the second domain.

9. The semiconductor device according to claim 8, further comprising a third power clamp circuit provided between the second high power source line and the first low power source line.

* * * * *